United States Patent
Coffey et al.

(10) Patent No.: US 11,077,519 B1
(45) Date of Patent: Aug. 3, 2021

(54) CLAMPING DEVICE THAT DEVELOPS BOTH AXIAL AND CIRCUMFERENTIAL CLAMPING FORCES IN RESPONSE TO A COMMON AXIAL CLAMPING FORCE

(71) Applicant: Seagate Technology LLC, Cupertino, CA (US)

(72) Inventors: Jerome Thomas Coffey, Boulder, CO (US); Samuel Edward Severson, Longmont, CO (US); Jeffrey L. Bruce, Longmont, CO (US); Patrick J. Hains, Longmont, CO (US); John W. Rigsby, Longmont, CO (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 208 days.

(21) Appl. No.: 16/170,816

(22) Filed: Oct. 25, 2018

(51) Int. Cl.
| | |
|---|---|
| *B25B 1/24* | (2006.01) |
| *B23K 20/12* | (2006.01) |
| *H05K 5/00* | (2006.01) |
| *G11B 33/02* | (2006.01) |
| *B23K 37/04* | (2006.01) |
| *H05K 5/06* | (2006.01) |

(52) U.S. Cl.
CPC .......... *B23K 20/126* (2013.01); *B25B 1/2478* (2013.01); *G11B 33/02* (2013.01); *H05K 5/0052* (2013.01); *B23K 37/0435* (2013.01); *H05K 5/066* (2013.01)

(58) Field of Classification Search
CPC .... B25B 1/02; B25B 1/20; B25B 1/24; B25B 1/2478; B25B 5/04; B25B 5/14; B25B 5/16; B25B 5/142; B25B 5/145; B25B 9/04; B25B 11/00; B25B 11/02; B25B 33/00; B23K 20/126
USPC ........................................ 269/109, 111, 112
See application file for complete search history.

(56) References Cited

U.S. PATENT DOCUMENTS

| | | | |
|---|---|---|---|
| 2,780,194 A | 2/1957 | Croswell | |
| 5,328,545 A | 7/1994 | Kaminski | |
| 6,554,175 B1 | 4/2003 | Thompson | |
| 7,490,750 B2 | 2/2009 | Trapp et al. | |
| 7,508,682 B2 | 3/2009 | Badarinarayan et al. | |
| 9,132,505 B2 | 9/2015 | Sunger et al. | |
| 2009/0140480 A1 | 6/2009 | Morfey | |
| 2013/0206817 A1 | 8/2013 | Tavares et al. | |
| 2014/0048995 A1* | 2/2014 | Li | B25B 5/142 269/153 |
| 2017/0239761 A1 | 8/2017 | Zhang et al. | |

* cited by examiner

*Primary Examiner* — Lee D Wilson
*Assistant Examiner* — Aaron R McConnell
(74) *Attorney, Agent, or Firm* — Kagan Binder PLLC

(57) ABSTRACT

Clamping devices and associated methods that are useful to develop both axial and circumferential clamping forces in response to a common axial clamping force. The clamp is able to use a simple mechanism to generate both kinds of clamping forces from a single, axial actuating force. The clamping devices of the present invention are particularly useful for clamping cover and base deck components of a hard disk drive enclosure together to allow the components to be joined and sealed together using welding techniques.

20 Claims, 25 Drawing Sheets

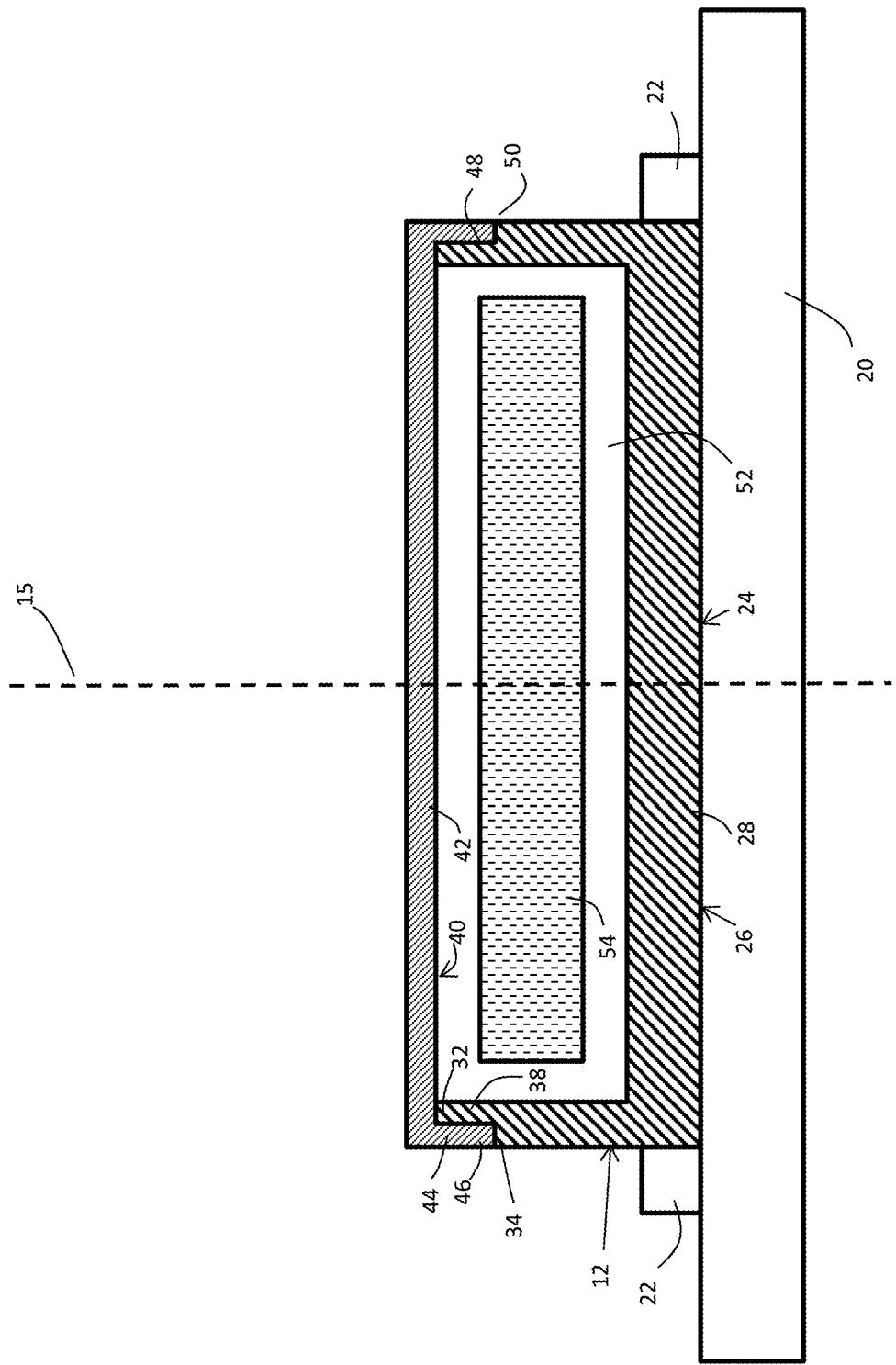

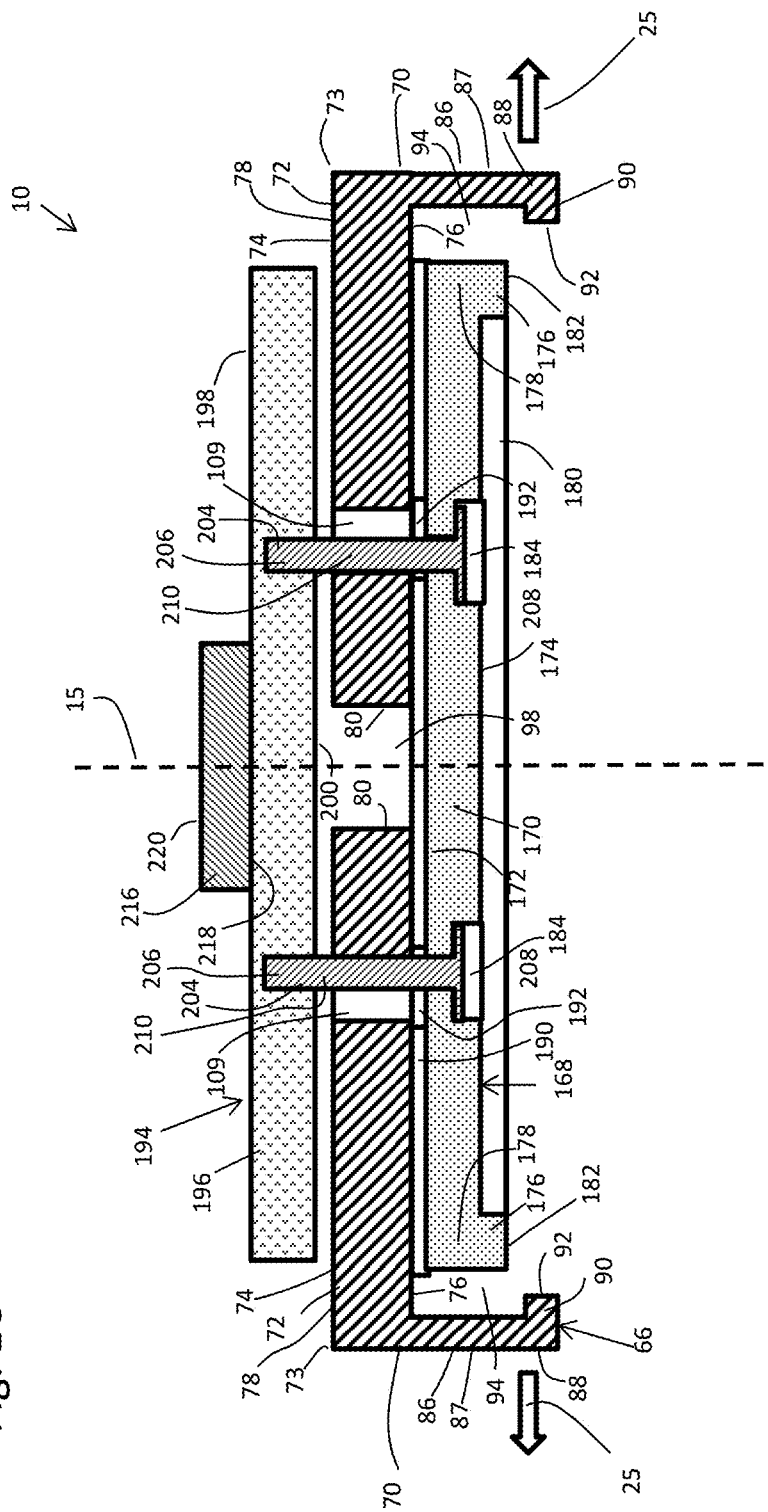

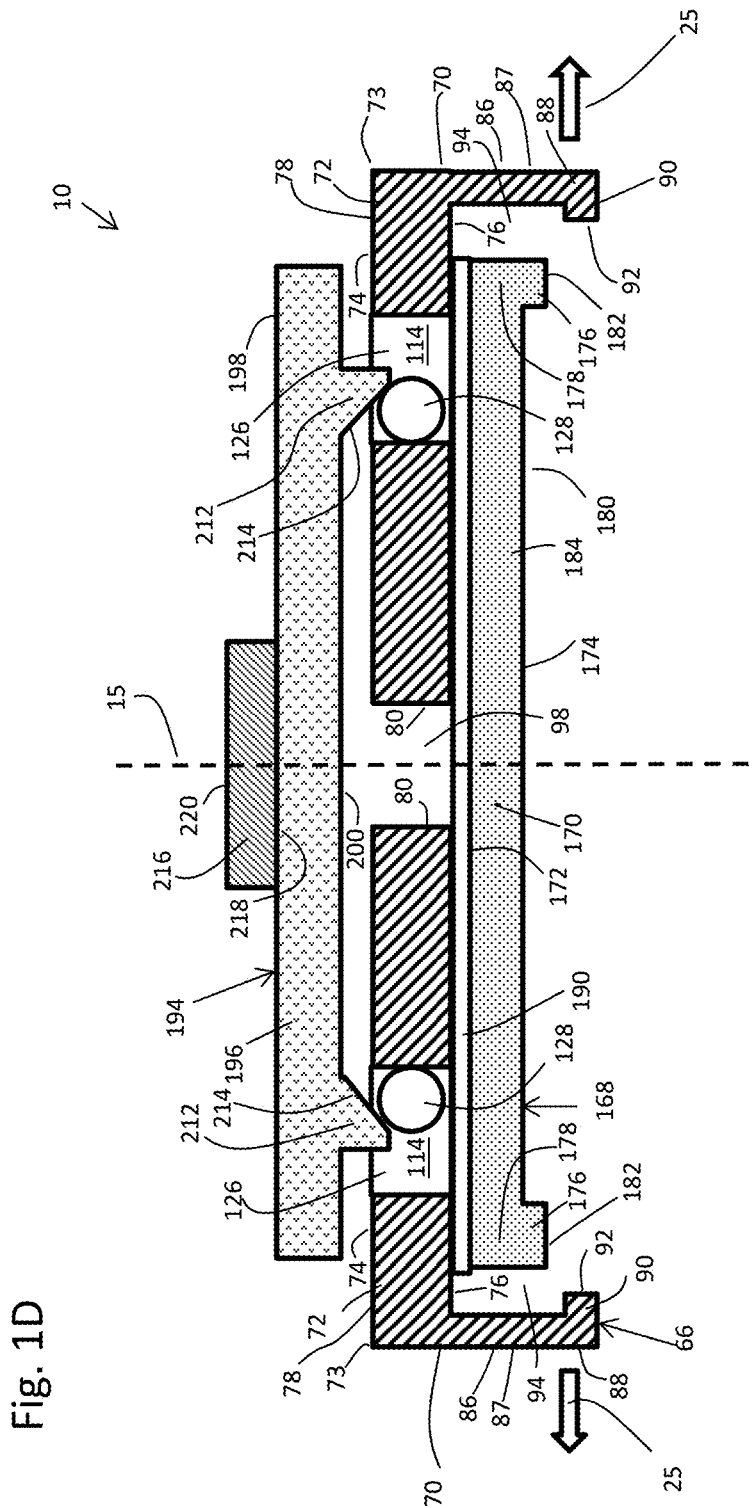

CLAMPING DEVICE THAT DEVELOPS BOTH AXIAL AND CIRCUMFERENTIAL CLAMPING FORCES IN RESPONSE TO A COMMON AXIAL CLAMPING FORCE

FIELD OF THE INVENTION

The present invention relates to a clamping device that develops both axial and circumferential clamping forces in response to a common axial clamping force. The clamping device of the present invention is particularly useful for holding cover and base deck components of a hard disk drive enclosure together to allow the components to be joined and sealed together using welding techniques.

BACKGROUND OF THE INVENTION

Electronic devices such as data storage devices (e.g., hard disk drives or "HDDs"), solid state memories, microelectronic devices, and computers (e.g., personal computers, cell phones, tablets, laptops, etc.) perform essential functions in today's digital information-intensive world. As our reliance on these devices increases, so do the performance requirements of these devices, including their combined speed and reliability.

To increase reliability of certain types of advanced electronic devices, e.g., hard disk drives, these devices can be constructed to include a housing that encloses components in a sealed chamber in order to protect the components from degradation due to oxidizing agents, particles, moisture, or other contaminants in the ambient environment. Additionally, a special atmosphere, such as a low density helium-containing atmosphere may be established inside the chamber, and the housing is desirably sufficiently impermeable to prevent undue leakage of the special atmosphere during the expected service life of the device.

There are various benefits to operating internal components of a hard disk drive in a low density atmosphere. As one benefit, a low density atmosphere can reduce the amount of drag force that affects a spinning disk or a stack of closely-spaced spinning disks. The reduced amount of drag can significantly reduce the amount of power required to cause a disk stack to spin. Also, a low density atmosphere can reduce the amount of unwanted, non-rotational movement or "flutter" that occurs in a spinning disk and a disk suspension during use. Reducing un-wanted motion of a disk or disk suspension can allow adjacent disks of a disk stack to be placed more closely together, which increases areal density (a measure of the quantity of information bits that can be stored on a given area of disk surface) by enabling a narrower data track pitch. Also advantageously, efficient thermal conduction of helium can allow for a reduced operating temperature of a device, and lower density gases (relative to air) can additionally produce less acoustic noise.

The housing that encloses the sealed chamber must be sufficiently impermeable to protect the sealed chamber from undue leakage of the special atmosphere or the undesired entry of undesired contaminants. One type of housing used for hard disk drives includes a base deck including a cavity that holds the internal components. A cover is then fit over the base deck. The joint between the cover and base deck is then welded to close the joint and seal the chamber. The quality of this weld is one factor that affects the ability of the housing to protect the conditions of the internal chamber. A poor quality weld may be too susceptible to damage or too permeable to the flow of gases.

Effectively clamping the base deck and cover components together is one key to achieving a high quality weld more easily. However, the housing components often are relatively thin, particularly the cover. Clamping could cause the cover and even the base deck to buckle or otherwise to be damaged by the clamping forces.

Accordingly, techniques are highly desired that allow housing components of hard disk drives to be effectively clamped together to allow the components to be welded together more easily with a reduced risk that clamping will damage the components. Techniques also are highly desired that provide welds that are strong, resistant to damage, and have low permeability to gases.

SUMMARY OF THE INVENTION

The present invention provides clamping devices and associated methods that are useful to develop both axial and circumferential clamping forces in response to a common axial clamping force. The clamp is able to use a simple mechanism to generate both kinds of clamping forces from a single, axial actuating force. The clamping devices of the present invention are particularly useful for clamping cover and base deck components of a hard disk drive enclosure together to allow the components to be joined and sealed together using welding techniques. This makes it easier to join and seal the enclosure components with high quality welds. The clamping devices provide a axial clamping force onto the cover while at the same time providing a circumferential, or in-plane, clamping force to help create intimate contact between the cover and the base deck. Advantageously, in some embodiments, the circumferential clamping force is applied against substantially all of the periphery of the housing components, even at the corners. This clamping strategy also helps to structurally support the clamped components, particularly the cover, to help avoid buckling or other damage that might occur during clamping or welding operations.

In one aspect, the present invention relates to a clamping device for holding a workpiece assembly with an axial clamping force and a circumferential clamping force responsive to an axial actuation force acting on the clamping device, said clamping device comprising:

a) a circumferentially resizable, subdivided clamping shroud defining a circumferentially resizable clamping enclosure, said clamping shroud comprising a plurality of shroud portions that are laterally translatable on demand, wherein the shroud portions are coupled together such that lateral translation of the shroud portions occurs in a coordinated manner through a range of motion comprising an open configuration in which the shroud portions are relatively farther apart relative to each other such that the clamping shroud is circumferentially enlarged relative to the workpiece assembly and a clamping configuration in which the shroud portions are relatively closer together laterally relative to each other such that the clamping shroud is circumferentially closed in a manner effective for the clamping shroud to circumferentially grip and clamp the workpiece assembly, wherein the shroud portions are under a bias to be in the open configuration, wherein the shroud portions are translated to the closed configuration in opposition to said bias responsive to the axial actuation force acting on the clamping device, and wherein at least one of the shroud portions comprises at least one corresponding bearing surface;

b) a clamping body housed at least partially in the resizable clamping enclosure, said clamping body being axially interposed between the clamping shroud and the workpiece assembly; and c) an actuating member coupled to the clamping shroud in a manner such that the axial actuation force acting on the clamping device causes the actuating member (i) to engage the at least one corresponding bearing surface of at least one shroud portion in a manner effective to both drive the at least one shroud portion laterally inward to cause the resizable clamping shroud to circumferentially grip and clamp the workpiece assembly, and (ii) to cause the clamping shroud to axially engage the clamping shroud and cause the clamping shroud to axially press against the clamping body to apply an axial clamping force against the workpiece assembly.

In another aspect, the present invention relates to a method of making a hard disk assembly, comprising the steps of:

a) fitting a cover onto a base deck holding a hard disk drive assembly in a manner such that the hard disk drive assembly is held in an enclosure formed by components comprising at least the base deck and the cover, wherein the fitted cover and base deck provide a workpiece assembly having an axis and a circumferential periphery, and wherein the fitted cover and base deck are joined at a lap joint having a seam;

b) applying an axial actuating force to a clamping device in a manner in a manner effective to generate both an axial clamping force and a circumferential clamping force that cooperatively grip and clamp the workpiece assembly, wherein at least a portion of the lap joint and the seam are exposed in a manner such that the circumferential clamping force helps to circumferentially support the workpiece assembly against deformation from the axial clamping force; and c) while the workpiece assembly is cooperatively gripped by the axial and circumferential clamping forces, treating the lap joint and the seam to join the cover to the base deck and seal the enclosure.

BRIEF DESCRIPTION OF THE DRAWINGS

FIG. 1A schematically shows a side cross-section view of a workpiece assembly positioned on a support, wherein a clamping device of the present invention will be used to hold the workpiece assembly with both an axial and circumferential clamping force while components of the workpiece assembly are joined together.

FIG. 1C schematically shows the view of FIG. 1B, further including shafts fitted into the aperture features to interconnect the components.

FIG. 1D schematically shows a further side cross section view of the clamping device and workpiece assembly of FIG. 2, wherein additional features of the clamping device are shown that allow an axial actuating force to cause clamping device component to be driven laterally inward to circumferentially clamp the workpiece assembly around at least a portion of the periphery of the workpiece assembly.

DETAILED DESCRIPTION OF PRESENTLY PREFERRED EMBODIMENTS

Figure 1B:
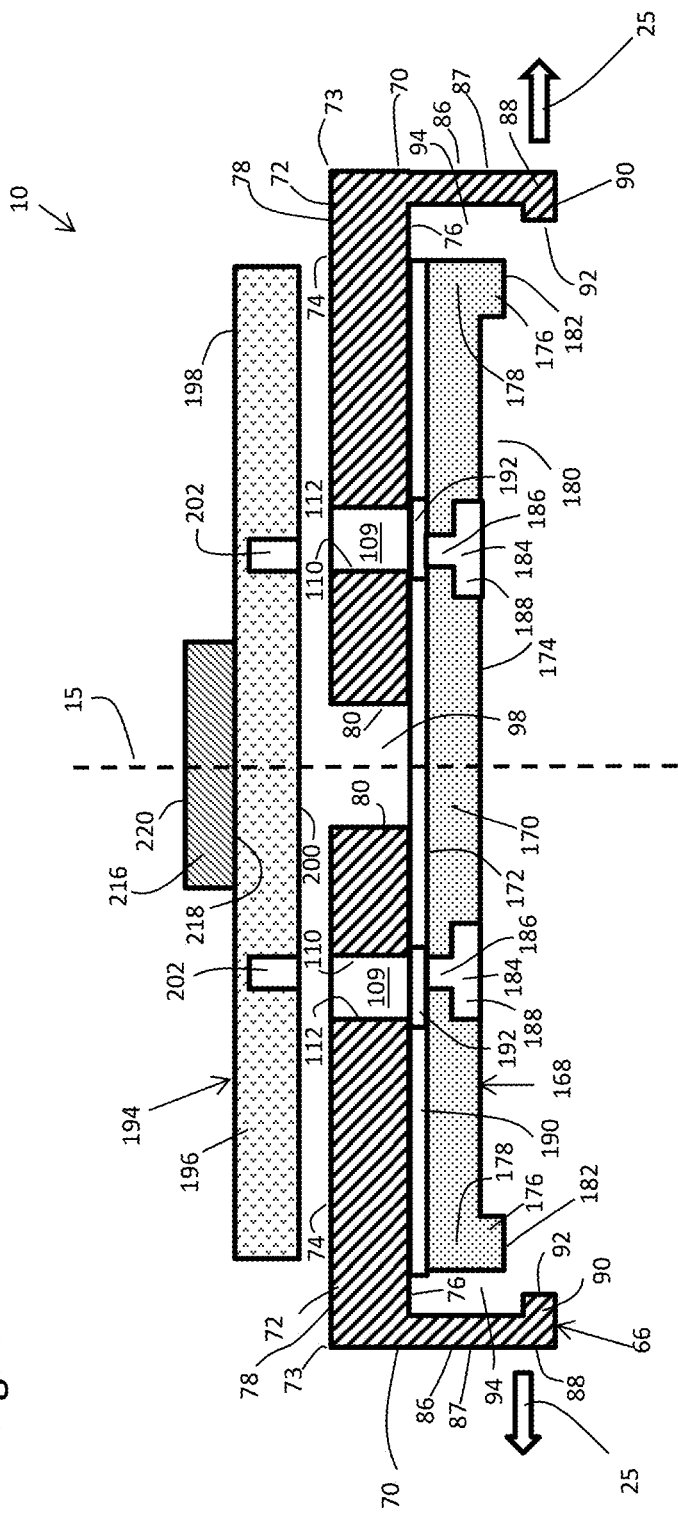
FIG. 1B schematically shows a side cross-section view of one embodiment of a clamping device of the present invention, wherein aperture features are shown that allow clamp components to be coupled together.
Figure 2:
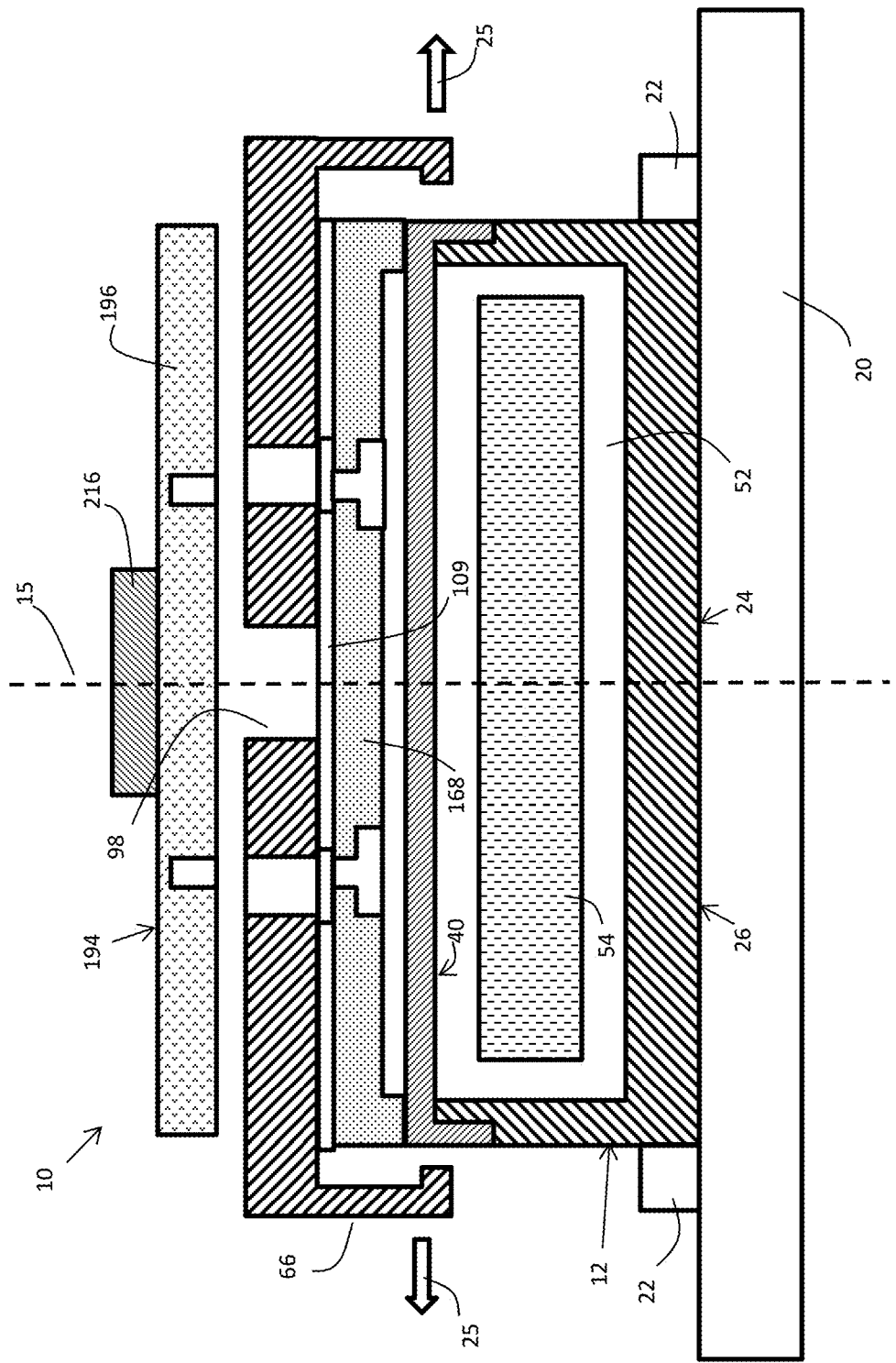
FIG. 2 schematically shows a side cross-section view of a clamping device of FIG. 1B placed onto the workpiece assembly of FIG. 1A, wherein shafts that are used to interconnect components of the clamping device are removed in order to show corresponding aperture features in the components that receive the shafts.
Figure 3:
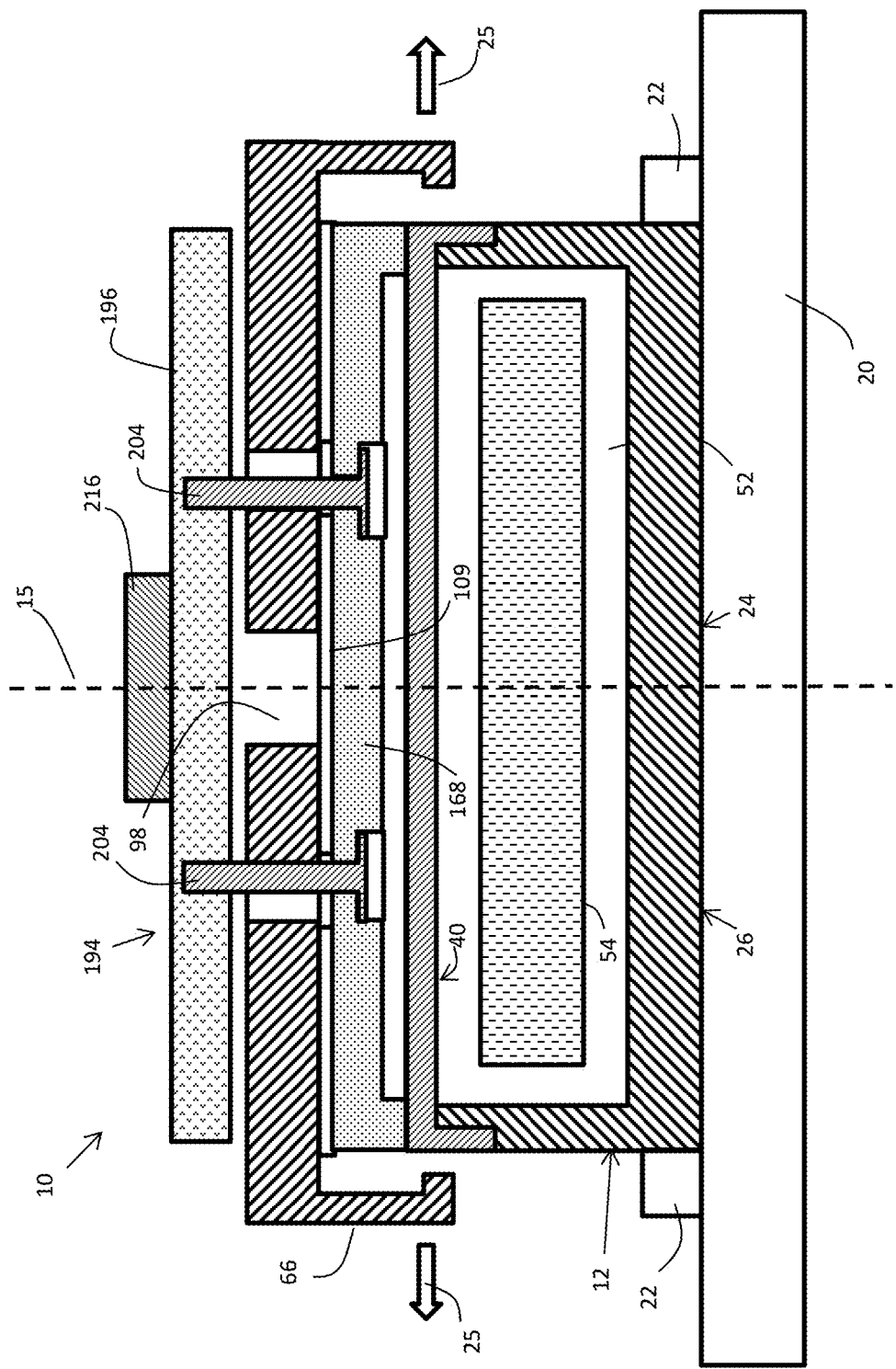
FIG. 3 schematically shows the view of FIG. 2, further including the shafts fitted into the aperture features to interconnect the components.

The present invention will now be further described with reference to the following illustrative embodiments. The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

An illustrative embodiment of a clamping device 10 of the present invention is schematically shown in FIGS. 1B to 22. As shown best in FIGS. 6, 7, 10, and 12, clamping device 10 is useful to hold a workpiece assembly 12 with both a circumferential clamping force 16 that grips assembly 12 at least partially around its periphery as well as an axial clamping force 18 parallel to the main axis 15 of the workpiece assembly 12. For purposes of illustration, main axis 15 coincides with a vertical, or z-axis. However, workpiece assembly 12 may be held with the main axis 15 being horizontal or at any other orientation. The circumferential and axial clamping forces 16 and 18 acting on the workpiece assembly 12 both result in response to a common, axial actuation force 18 acting on the clamping device 10 along a direction of main axis 15 toward the assembly 12. The result is that the clamping device 10 holds workpiece assembly 12 with at least two kinds of clamping forces simultaneously.

Referring mainly to FIG. 1A but also as shown in FIGS. 2 through 7, workpiece assembly 12 is secured on a support 20 by clamping device 10 as well as fixtures 22 to help hold workpiece assembly 12 in position to carry out desired work on assembly 12. For purposes of illustration, workpiece assembly 12 is in the form of a hard disk drive apparatus including a housing 24 formed from a base deck 26 and a cover 40. Housing 24 defines an enclosed chamber 52 for protecting hard disk drive assembly 54. Workpiece assembly 12 is held in a manner suitable for the cover 40 to be secured to base deck 26 by a suitable attachment and sealing technique such as welding.

For example, cover 40 may be attached to base deck 26 using friction stir welding techniques such as those described in in Assignee's co-pending U.S. patent application Ser. No. 15/698,990, filed Sep. 8, 2017, titled ASSEMBLIES, DEVICES WITH A FRICTION STIR WELD, PRECURSORS THEREOF, AND RELATED METHODS, by Jerome Thomas Coffey et al; and co-pending U.S. patent application Ser. No. 15/993,940, filed May 31, 2018, titled DISK DRIVE APPARATUS INCLUDING PRETREATED, WELDED HOUSING THAT PROVIDES SEALED CAVITY FOR HOLDING HARD DISK DRIVE COMPONENTS, by David R. Lapp et al.; and co-pending U.S. patent application Ser. No. 15/698,949, filed Sep. 8, 2017, titled FRICTION STIR WELDING TOOL, RELATED METHODS, AND ASSEMBLIES FORMED TO INCLUDE FRICTION STIR WELD, by Jerome Thomas Coffey et al. The entirety of each of these co-pending patent applications is respectively incorporated herein by reference for all purposes in its entirety.

Advantageously, clamping device 10 not only securely holds cover 40 onto the base deck 26 by the circumferential and axial clamping forces 16 and 18, but the circumferential clamping force 16 helps to structural support the cover 40 to avoid buckling, creasing, distortion, or other degradation of the cover 40 that otherwise could be experienced during the clamping and welding operations without such structural support. Thus, the clamping device 10 not only provides clamping functionality, but device 10 also helps preserve the integrity of the workpiece assembly components while they are coupled and sealed together.

As shown mainly in FIG. 1A, but as also shown in FIGS. 2 to 7, base deck 26 includes a base panel 28 and a sidewall 30 that projects upward from base panel 28. Sidewall 30 includes a circumferential rabbet feature near top rim 32 defined at least in part by the shoulder 34 and the inset upper sidewall portion 38. Cover 40 includes cover panel 42 and a sidewall 44 that projects downward from cover panel 42. Cover 40 is sized so that the sidewall 44 fits snugly onto the rabbeted portion of the base deck 26 in a manner so that the bottom rim 46 of cover 40 is supported on shoulder 34 and a lower portion of sidewall 44 fits against upper sidewall portion 38 with a lap joint 48. A seam 50 results between bottom rim 46 and shoulder 34. Clamping device 10 holds workpiece assembly 12 so that this seam 50 and at least a portion of lap joint 48 are accessible and can be welded to form an environmental seal to protect hard disk drive assembly 54 housed in the enclosed chamber 52. When using welding techniques such as friction stir welding techniques, adjacent portions of the lap joint 48 will tend to be welded together as well, which helps to form a larger, more durable connection between base deck 26 and cover 40.

As shown in FIGS. 1B to 1D, clamping device 10 includes clamping shroud 66, clamping body 168, and actuating member 194 as main components. The clamping shroud 66 is is seen best in FIGS. 1B through 1D and 2-14 and 16-22. Clamping shroud 66 defines a clamping enclosure 68 (FIG. 8) in an interior of the clamping shroud 66. Clamping shroud 66 is subdivided to comprise a plurality of shroud portions 70 that in combination form at least a portion of the clamping shroud 66. For purposes of illustration, clamping shroud 66 is shown is being subdivided into four shroud portions 70, each corresponding to a quadrant of clamping shroud 66. However, in other embodiments, clamping shroud 66 may be subdivided into 2 or 3 shroud portions 70 or even 4 or more shroud portions. In many embodiments, it is preferred to subdivide shroud 66 into 2 to 6 shroud portions 70, with 4 shroud portions 70 being more preferred as shown in the Figures. Using 4 shroud portions 70 subdivides the clamping shroud 66 into quadrants, wherein each quadrant includes a corresponding shroud portion 70.

Each shroud portion 70 may be the same or different from the other portions 70. For purposes of illustration, the four shroud portions 70 generally are identical in features and differ in orientation and configuration depending on how each corresponds to a different quadrant of the clamping shroud 66. For example, shroud portions 70 that are adjacent end to end or side to side are generally mirror images of each other. Shroud portions 70 that are adjacent diagonally are the same.

Each shroud portion 70 includes a cover panel 72 and a sidewall 86 extending from the cover panel 72 in an axial direction parallel to the axis 15. The cover panels 72 and the sidewalls 86 of the shroud portions 70 cooperatively form the circumferentially resizable, subdivided clamping shroud 66 and the circumferentially resizable clamping enclosure 68 in the interior of the clamping shroud 66. The shroud portions 70 are separated by side to side, resizable gaps 96 (FIGS. 8, 9, 11, 12) and resizable end to end gaps 98 (FIGS. 1B to 9, 11, and 12).

The cover panel 72 of each shroud portion 70 includes an exterior face 74 and an interior face 76. Exterior face 74 faces toward the actuating member 194 and interior face 76 faces toward the clamping body 168. Cover panel 72 has outer end 78 and inner end 80. Outer end 78 faces outwardly toward the exterior of the clamping shroud 66 while inner end 80 is positioned longitudinally adjacent to a corresponding inner end 80 of a longitudinally adjacent shroud portion 70. Cover panel 72 also includes an outer side 82 and an inner side 84. Outer side 82 faces outwardly toward the exterior of the clamping shroud 66 while the inner side 84 is positioned laterally adjacent to a corresponding inner side 84 of a laterally adjacent shroud portion 70. Sidewall 86 extends from the outer end 78 and outer side 82.

Each sidewall 86 extends continuously around the periphery of the outer end 78 and outer side 82 to help provide substantially continuous, peripheral clamping action as described further below. Each sidewall 86 thus has an L-shape include end portion 87 projecting from outer end 78 and side portion 89 projecting from outer side 82. Portions 87 and 89 join at corner 91.

Sidewall 86 includes a lower rim 88. Proximal to the lower rim 88, a clamping jaw 90 projects laterally inward toward the inside of the clamping enclosure 68. The clamping jaw 90 includes a clamping surface 92 to help peripherally grip and clamp the workpiece assembly 12. During clamping action, a gap 94 is formed between the sidewall 86 and the clamping body 168 so that the clamping surfaces 92 are able to firmly clamp workpiece assembly 12 without clamping body obstructing the operation of closing the clamping shroud 66 to grip and clamp workpiece assembly 12.

Figure 8:
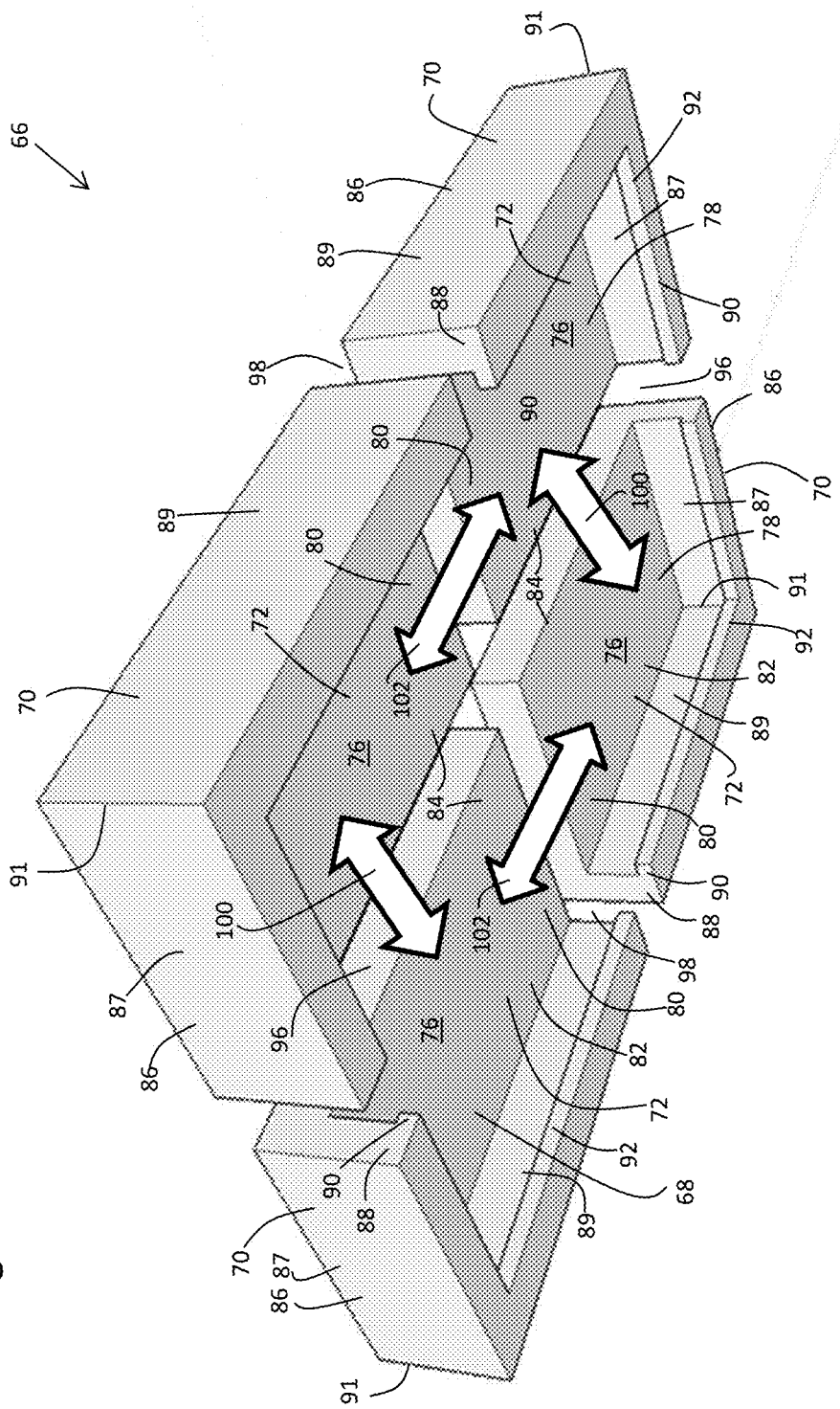
FIG. 8 is a schematic, bottom perspective view of a clamping shroud incorporated into the clamping device of FIGS. 1B through 7 showing how the clamping shroud is subdivided into shroud portions and the shroud portions are under a bias that causes the shroud portions to tend to move apart laterally and longitudinally relative to each other.
Figure 9:
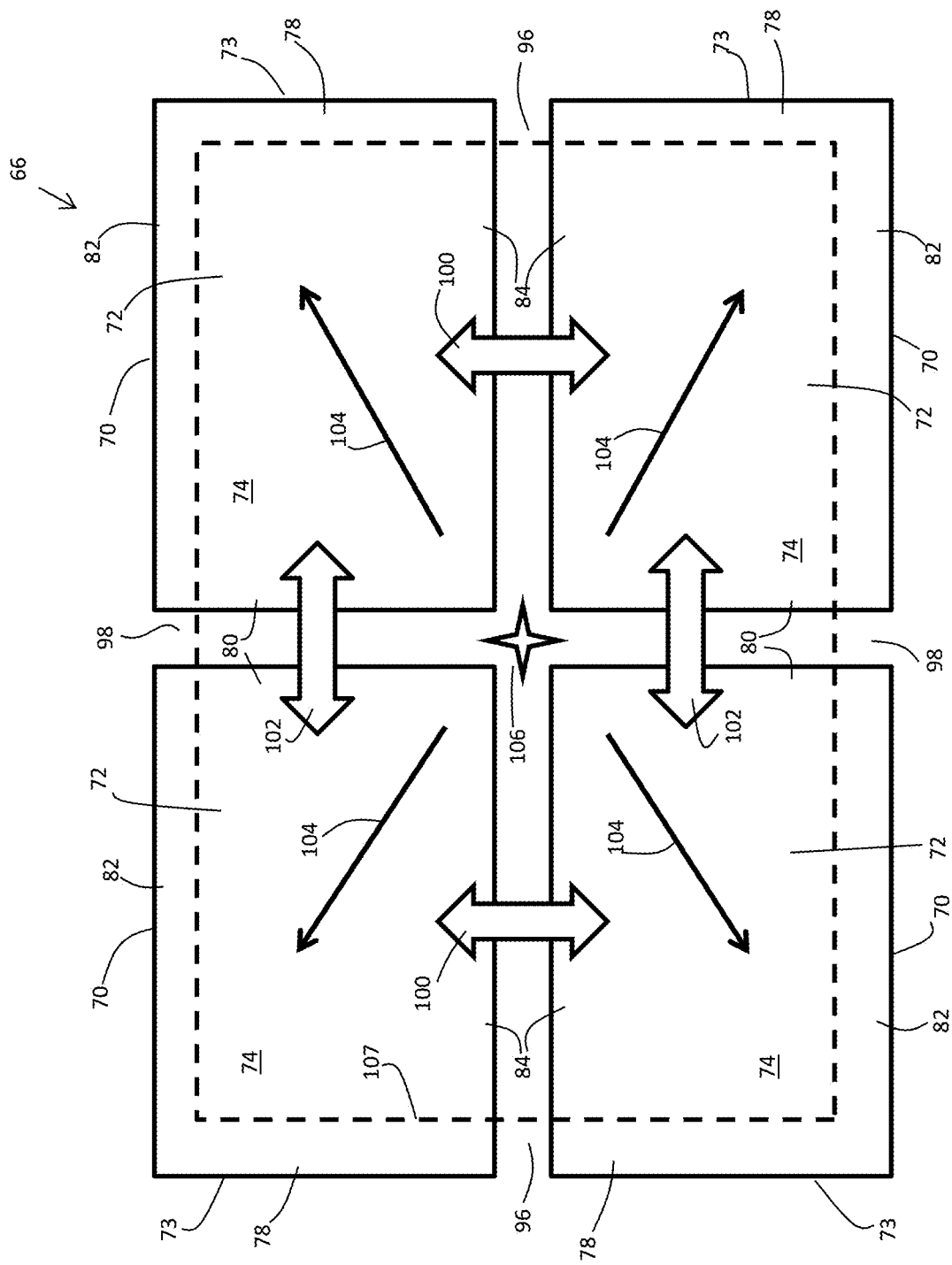
FIG. 9 is a schematic, top plan view of the shroud portions of FIG. 8, showing how the bias causes the shroud portions to move laterally outward in a coordinated fashion.
Figure 10:
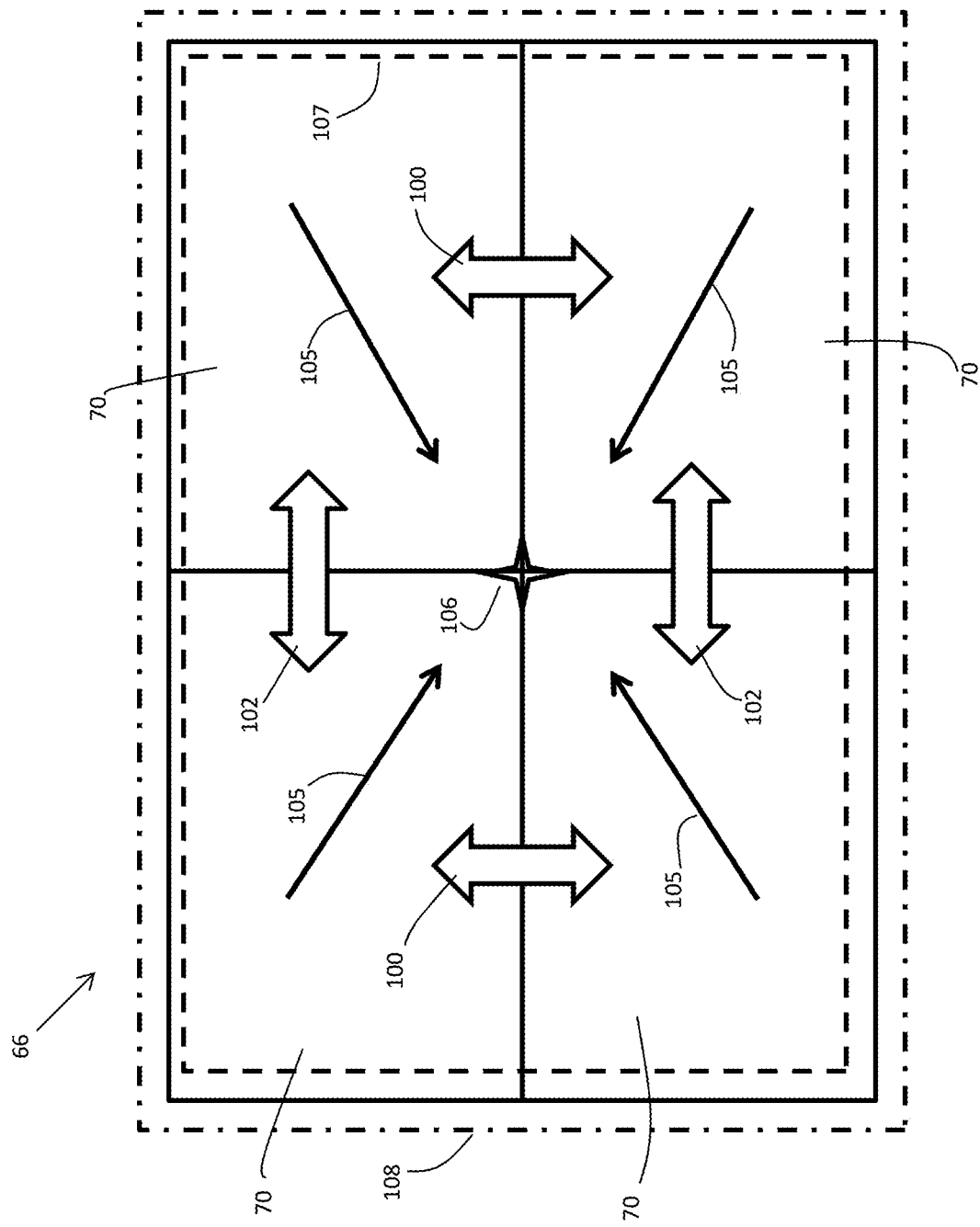
FIG. 10 is a schematic, top plan view of the shroud portions of FIG. 8, showing how an axial actuation force causes the shroud portions to move together laterally to overcome the bias, which allows the shroud portions to circumferentially grip the workpiece assembly.

The resizable characteristics of the clamping shroud 66 and the lateral motion of the shroud portions 70 are schematically illustrated in FIGS. 8 to 10. The clamping shroud 66 is circumferentially re-sizeable in that the circumference, and hence the size, of the clamping shroud 66 and the clamping enclosure 68 can be changed on demand. The shroud portions 70 are coupled together such that the lateral translation of the shroud portions 70 occurs in a coordinated manner through a range of motion comprising an open configuration in which the shroud portions 70 are relatively farther apart relative to each other such that the clamping shroud 66 is circumferentially enlarged relative to the workpiece assembly 12. The range of motion also includes a clamping configuration in which the shroud portions 70 are relatively closer together laterally relative to each other such that the clamping shroud 66 is circumferentially closed in a manner effective for the clamping shroud 66 to circumferentially grip the workpiece assembly 12.

The shroud portions 70 are biased to be in the open configuration as shown by bias force arrows 25. The shroud portions 70 are translated to the closed configuration in opposition to the bias in response to the axial actuation force 14 acting on the clamping device 10.

Figure 11:
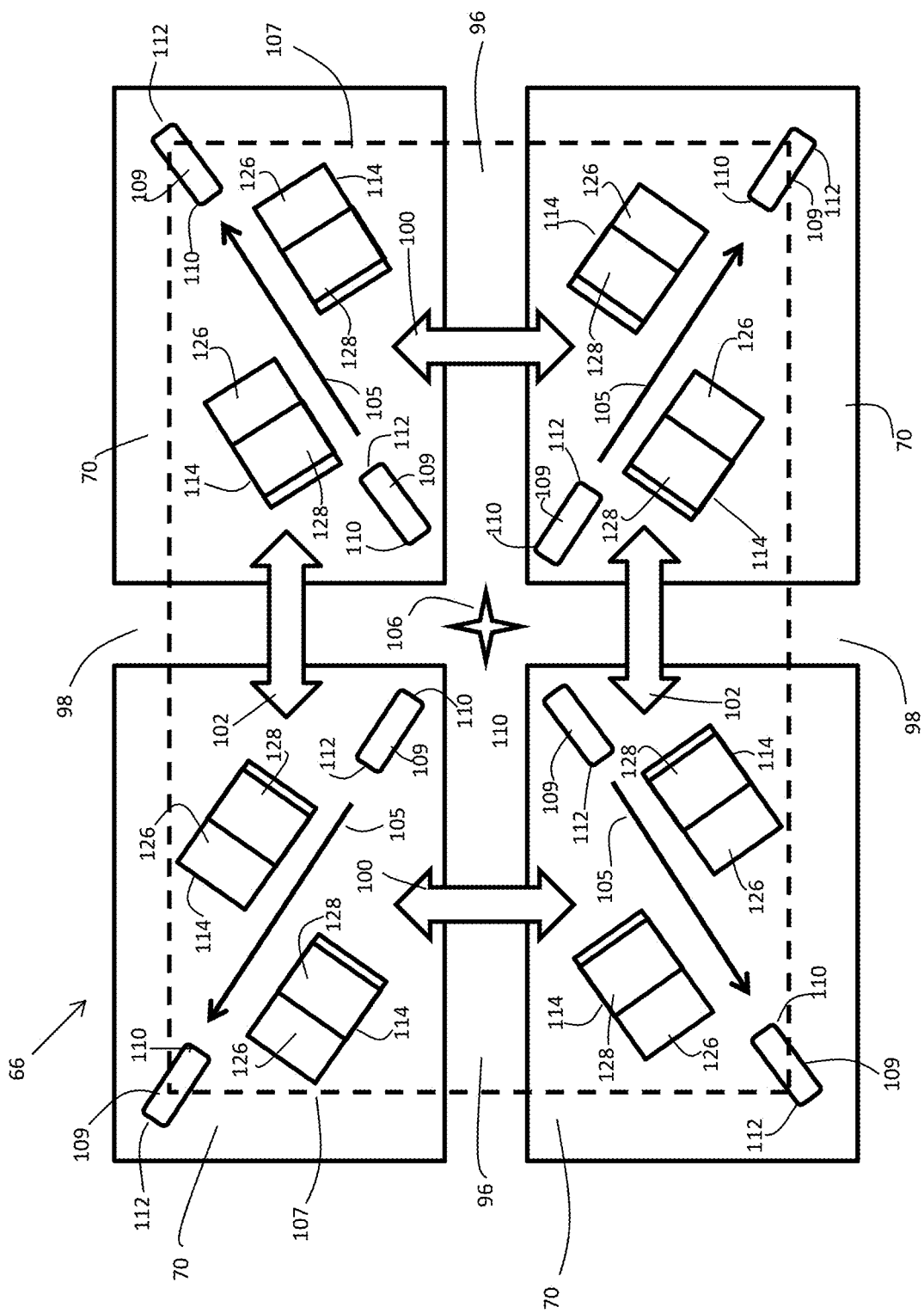
FIG. 11 is a more detailed, schematic, top plan view of the shroud portions showing features of the shroud portions that are used to operatively couple the shroud portions to other components of the clamping device, wherein the shroud portions are in the open configuration of FIG. 9.

Referring to FIGS. 8 to 12, lateral springs 100 schematically shown by the corresponding double arrows 100 are configured to laterally push against and spread apart laterally adjacent shroud portions 70. At the same time, longitudinal springs schematically shown by the double arrows 102 are configured to longitudinally push against and spread apart longitudinally adjacent shroud portions. In the absence of the actuating force 14, FIGS. 8, 9, and 11 show how the action of the springs 100 and 102 causes shroud portions 70 to be pushed diagonally outward as shown by the outward range of motion arrows 104 in a coordinated and generally uniform manner relative to a central reference site 106. For reference, the footprint of the workpiece assembly 12 inside the clamping enclosure 68 is shown by the dotted line 107. The outward motion of the shroud portions 70 responsive to the springs 100 and 102 is constrained by coupling features described further below. In the configuration of FIGS. 8, 10, and 11, the gaps 96 and 98 are relatively wide. FIGS. 8, 10, and 11 show clamping shroud 66 in the enlarged, open configuration in which workpiece assembly 12 is not gripped or clamped by the clamping forces 14 and 16 of clamping device 10. Consequently, this configuration is suitable for inserting or removing the workpiece assembly 12 from the clamping device 10.

Figure 12:
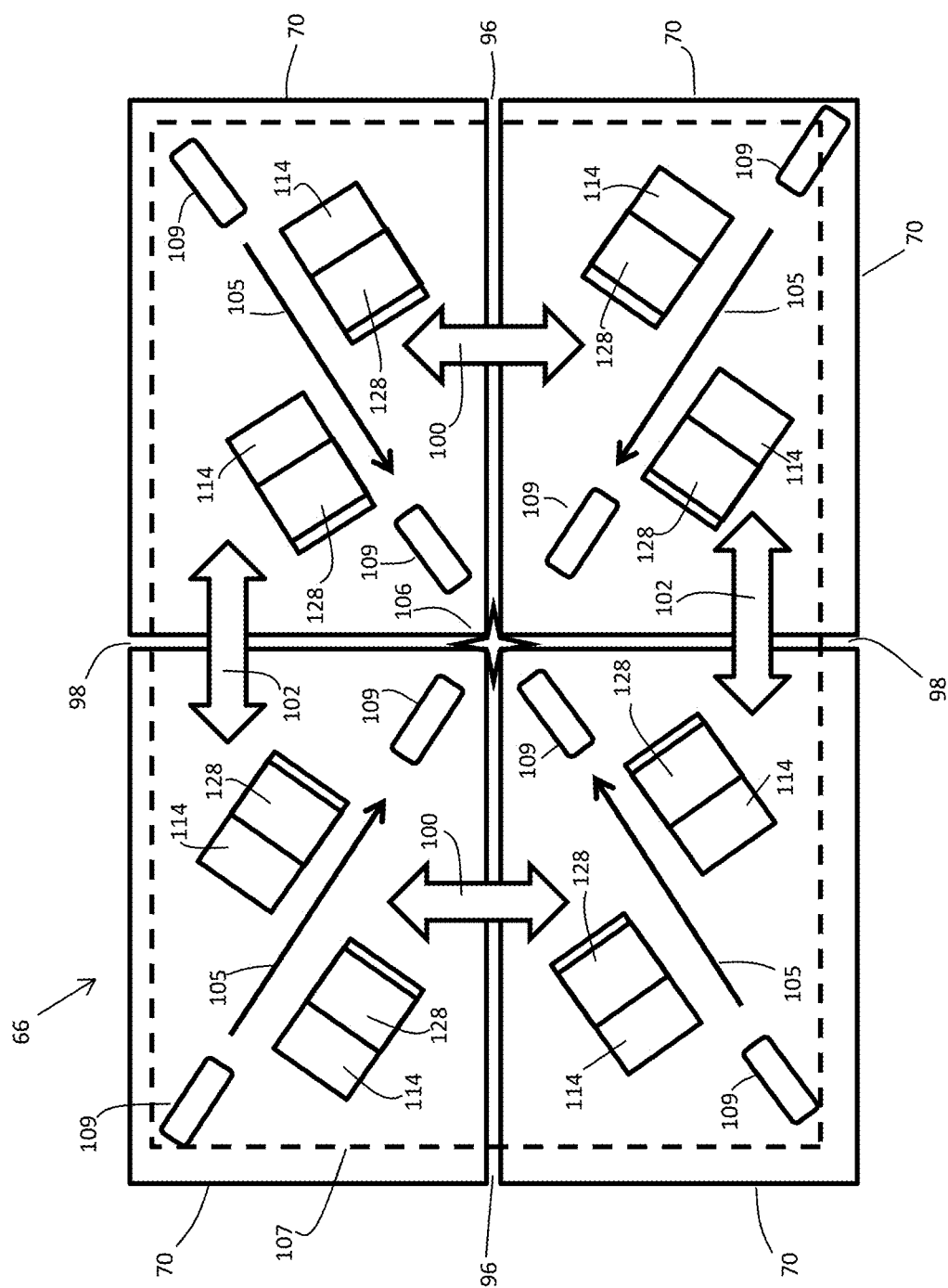
FIG. 12 is a more detailed, schematic, top plan view of the shroud portions showing features of the shroud portions that are used to operatively couple the shroud portions to other components of the clamping device, wherein the shroud portions are in the closed configuration of FIG. 10.
Figure 13:
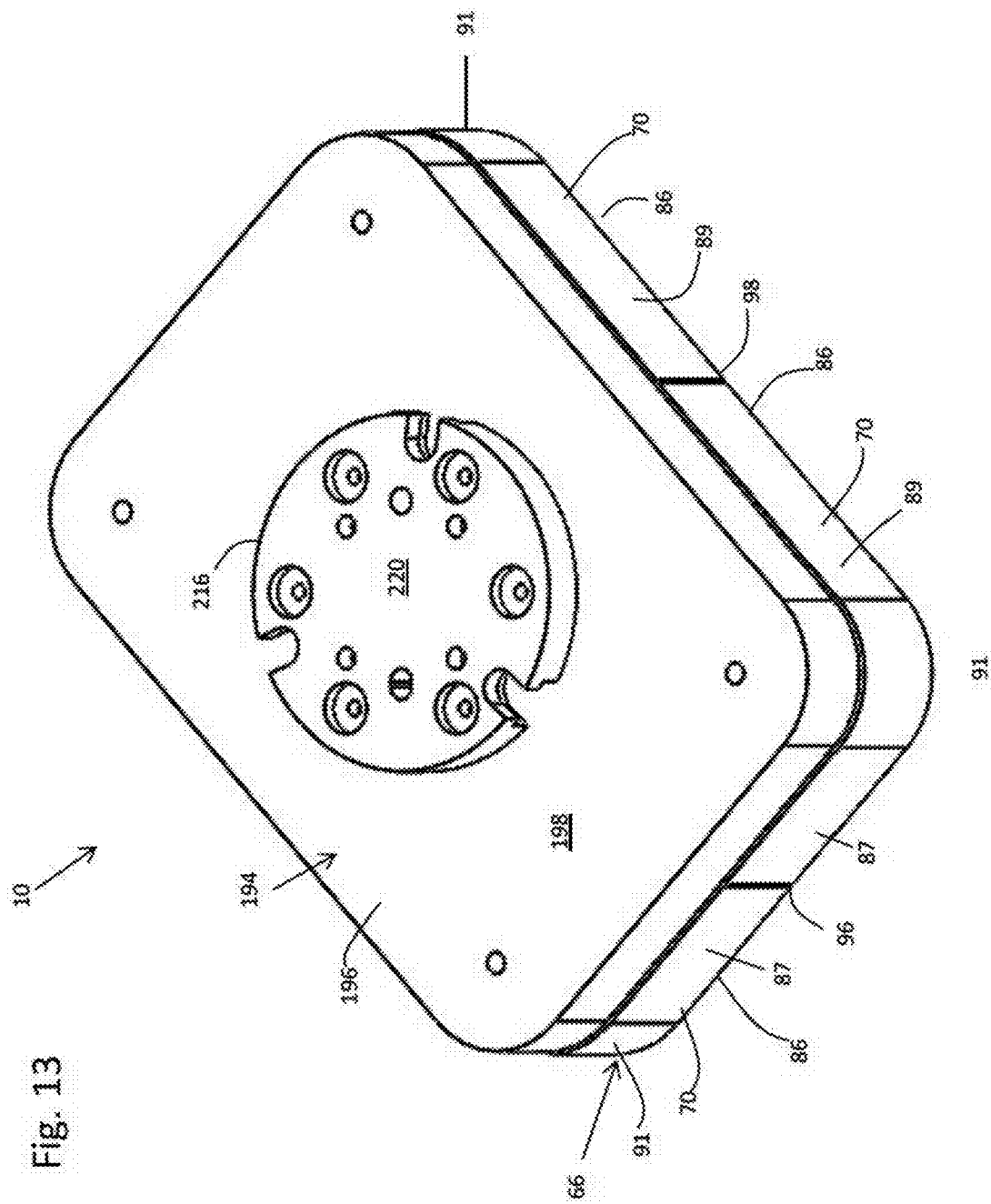
FIG. 13 is a top perspective view of the clamping device shown in FIG. 1B.
Figure 14:
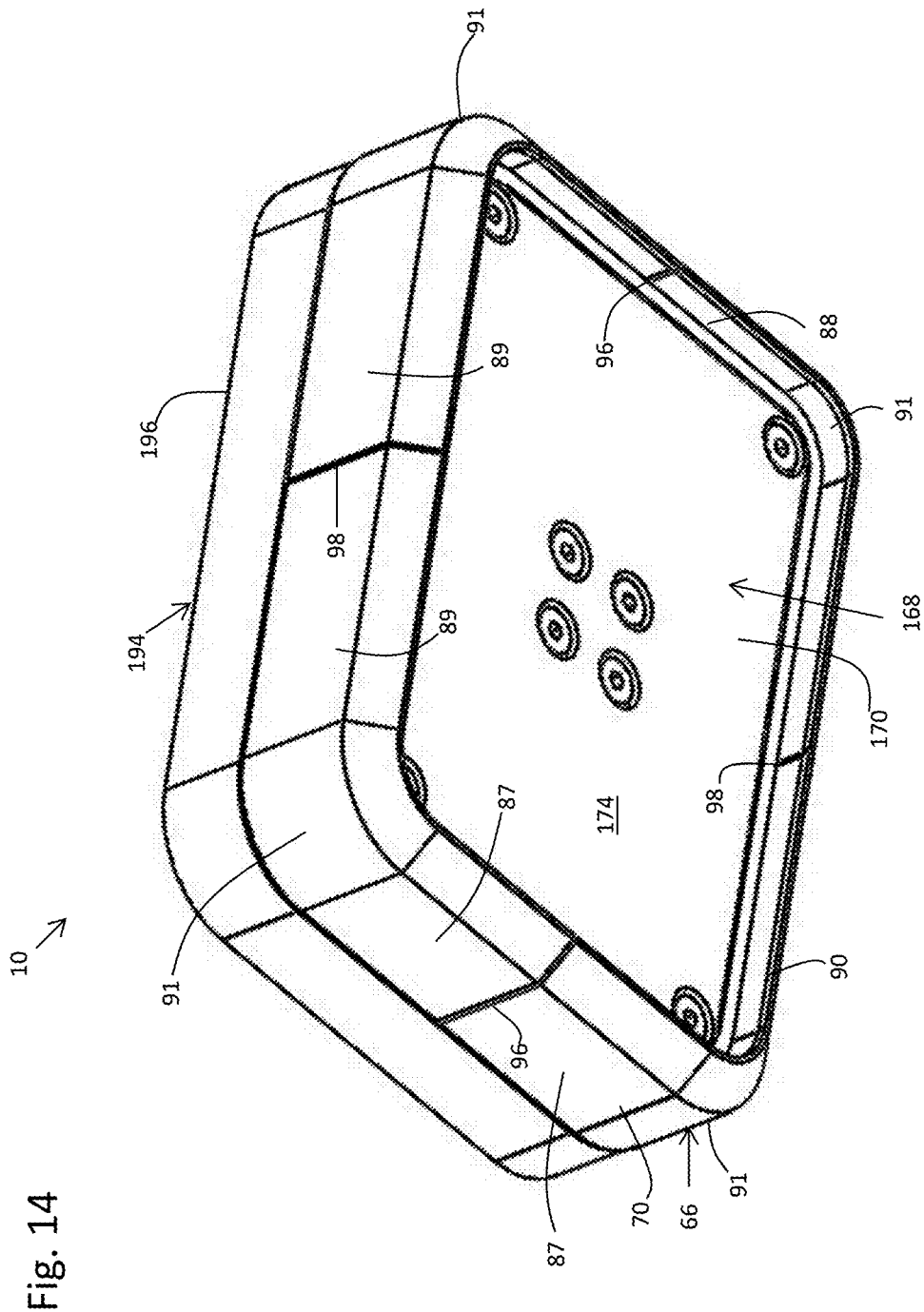
FIG. 14 is a bottom perspective view of the clamping device shown in FIG. 1B.
Figure 15:
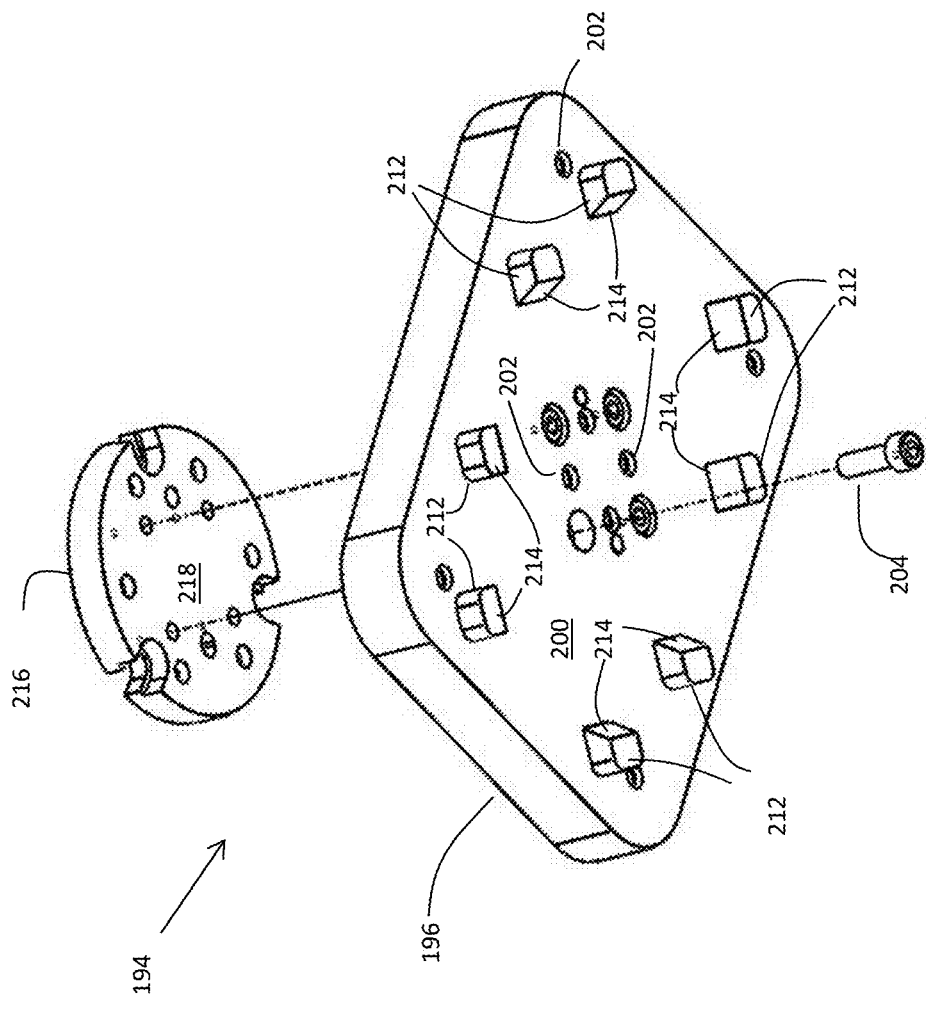
FIG. 15 is an exploded, bottom perspective view of an actuating member incorporated into the clamping device of FIG. 1B.
Figure 16:
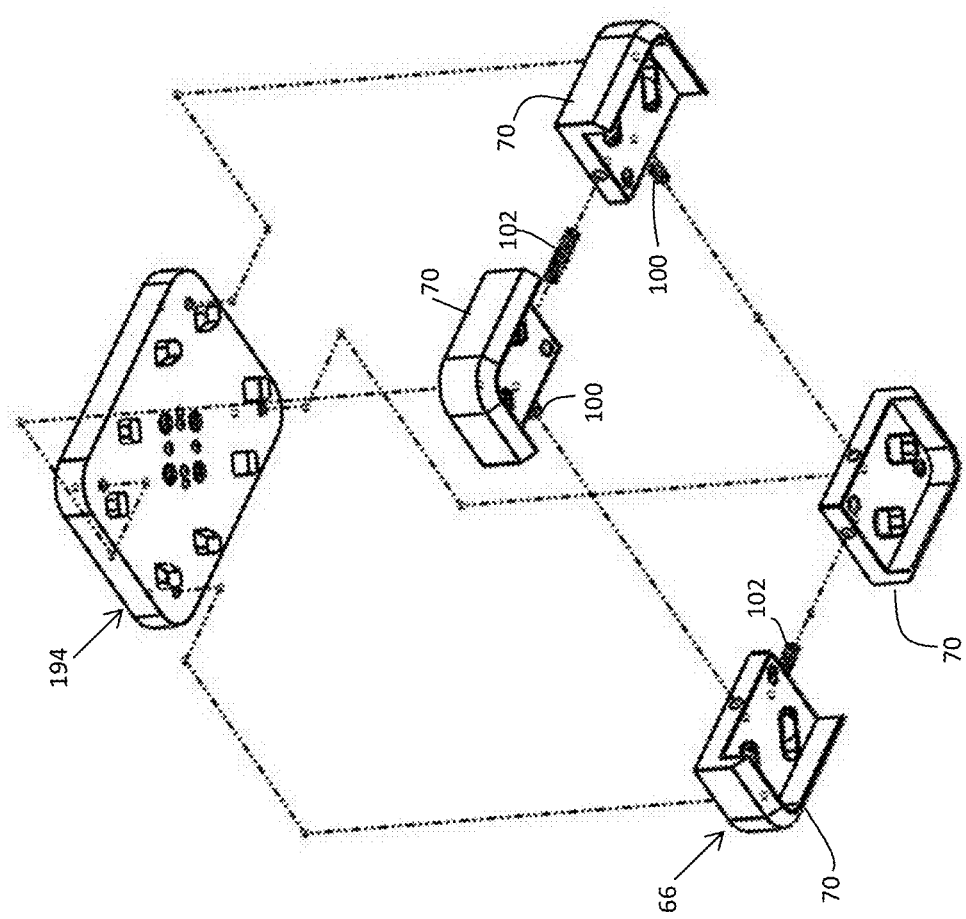
FIG. 16 is an exploded, bottom perspective view of a portion of the clamping device of FIG. 1B, showing how the shroud portions constituting the subdivided clamping shroud are assembled with respect to the actuating member of FIG. 15.
Figure 17:
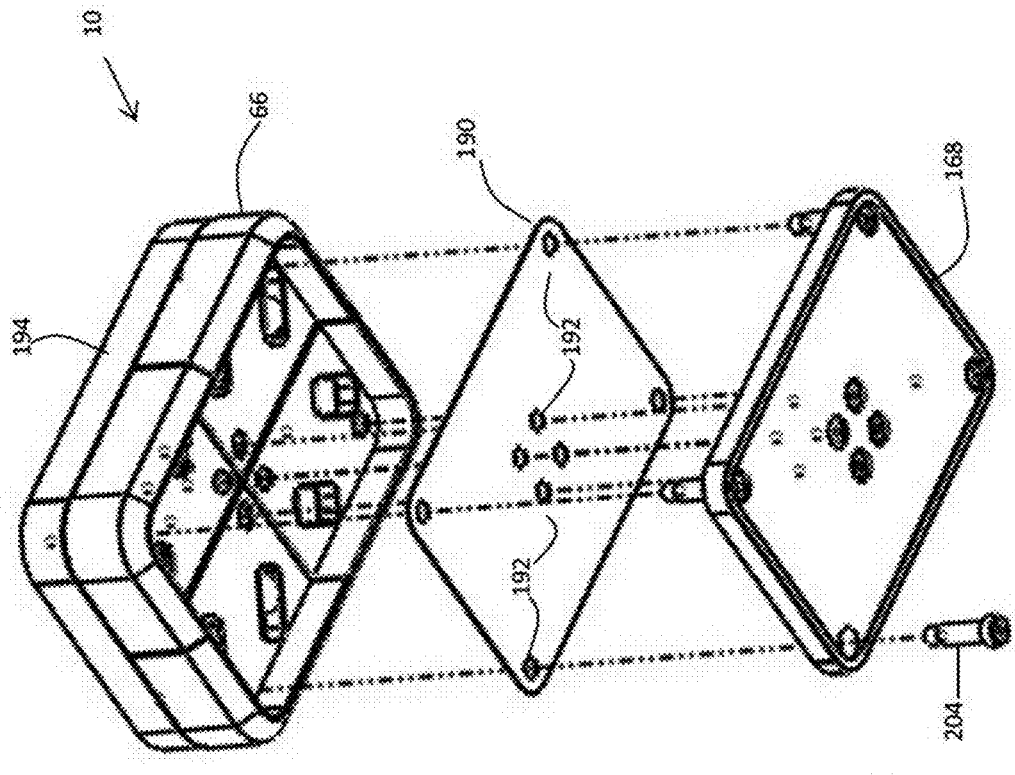
FIG. 17 is an exploded, bottom perspective view of a portion of the clamping device of FIG. 16, further showing how a low friction sheet and a clamping body are assembled with respect to the actuating member and the clamping shroud of FIG. 17.
Figure 18:
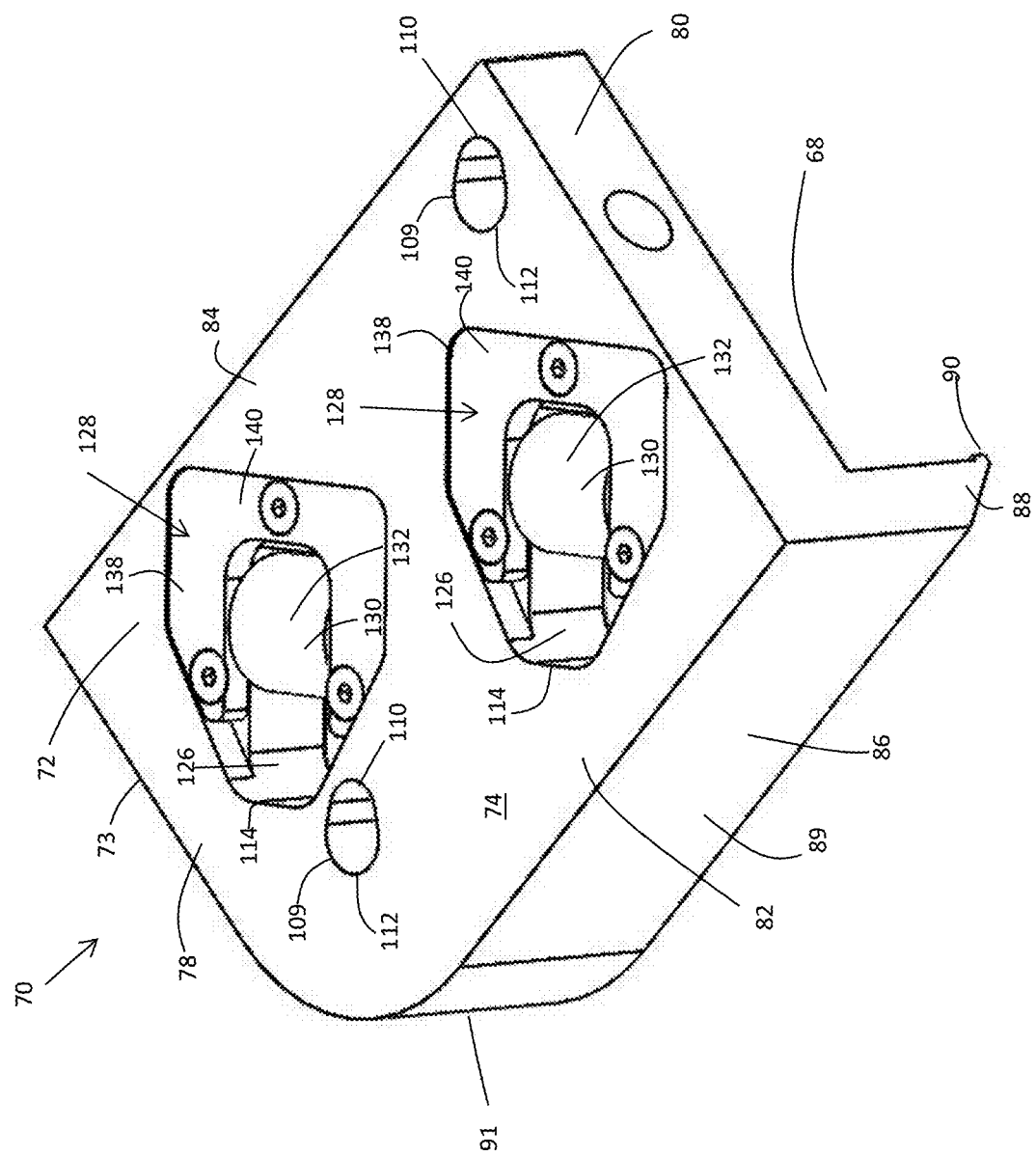
FIG. 18 is a top perspective view of a shroud portion of FIG. 16, showing how bearing assemblies and elongated slots are incorporated into the shroud portion.
Figure 19:
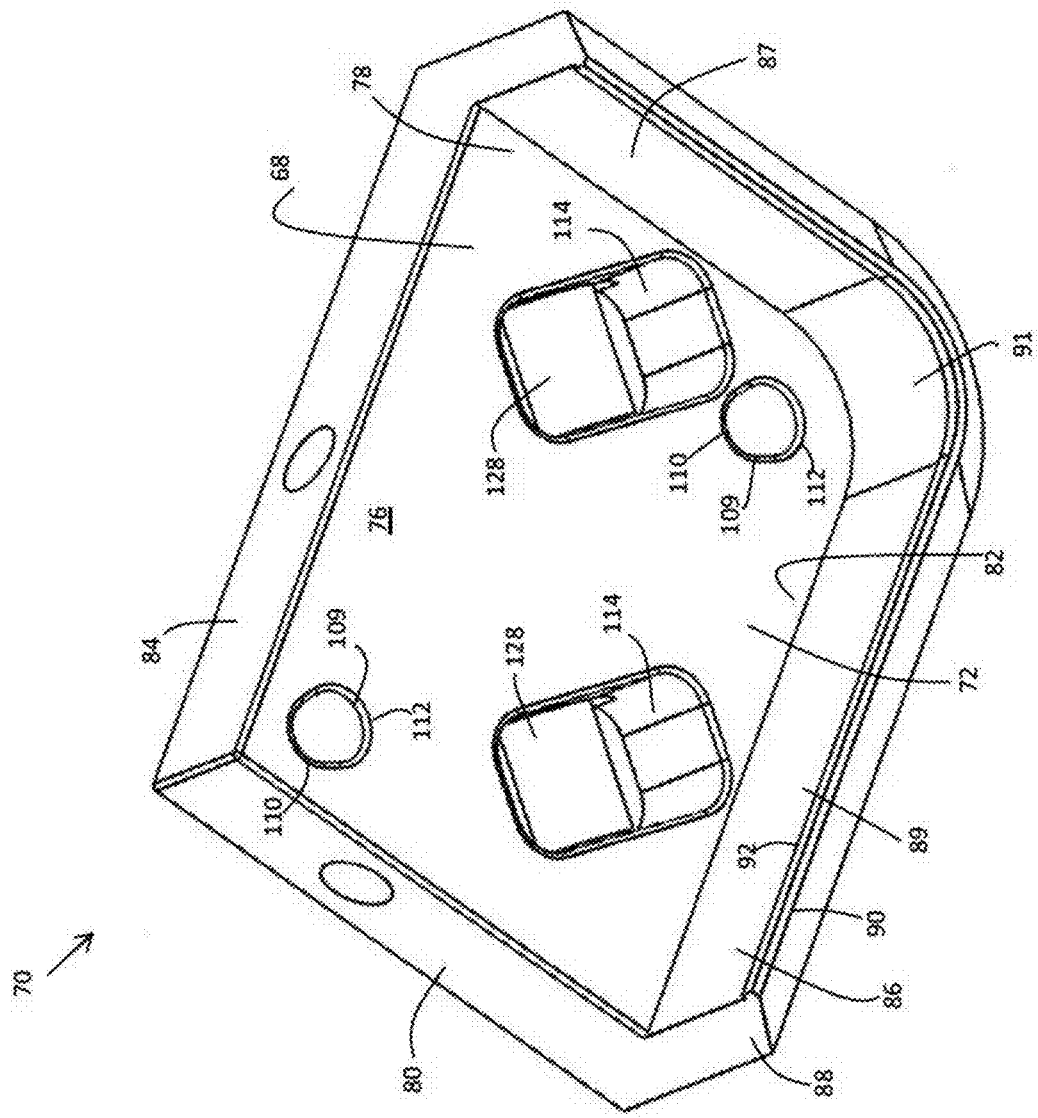
FIG. 19 is a bottom perspective view of the shroud portion of FIG. 18.
Figure 20:
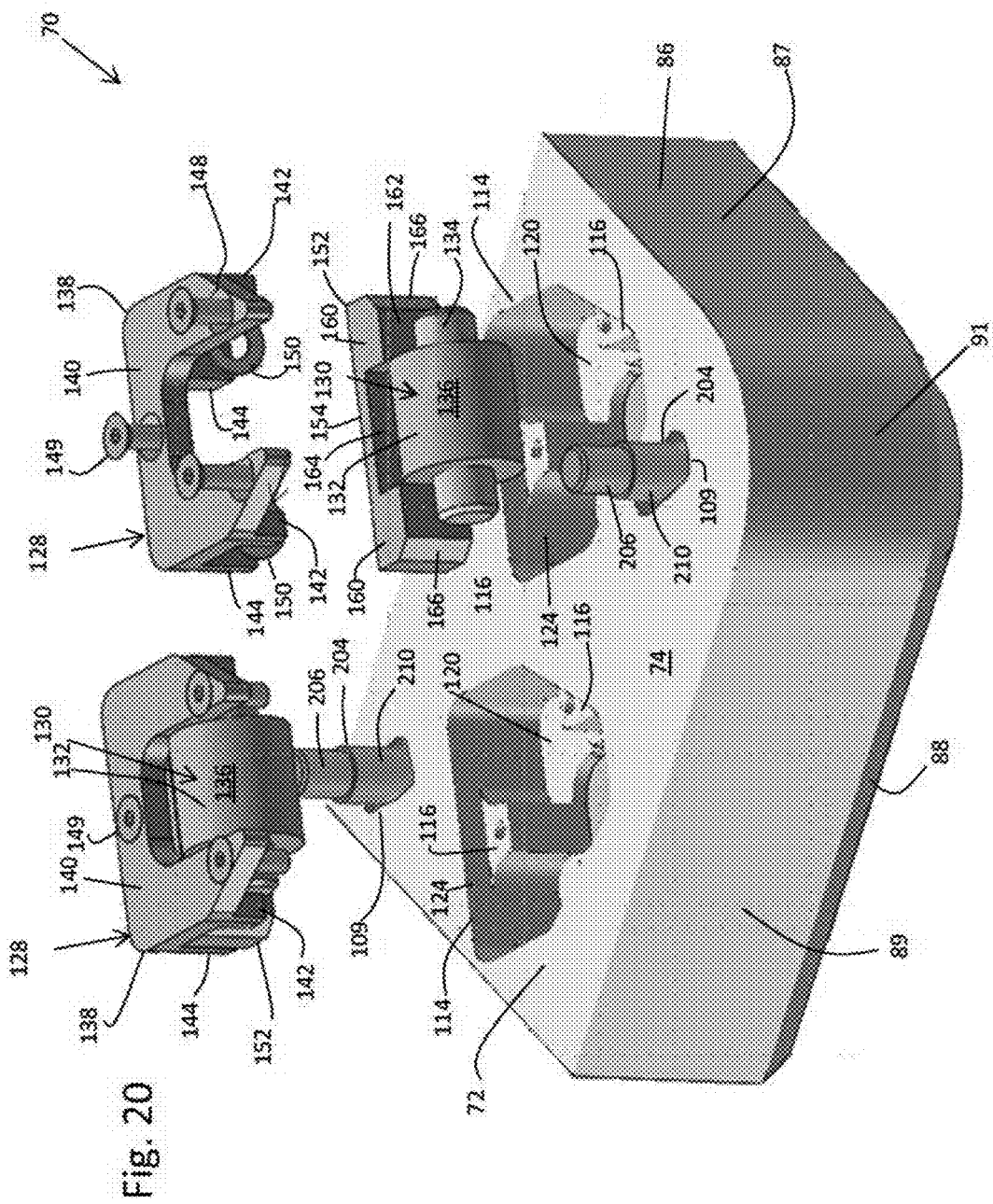
FIG. 20 is an exploded perspective view of the shroud portion of FIG. 18 showing details of the bearing assemblies incorporated into the shroud portion.
Figure 21:
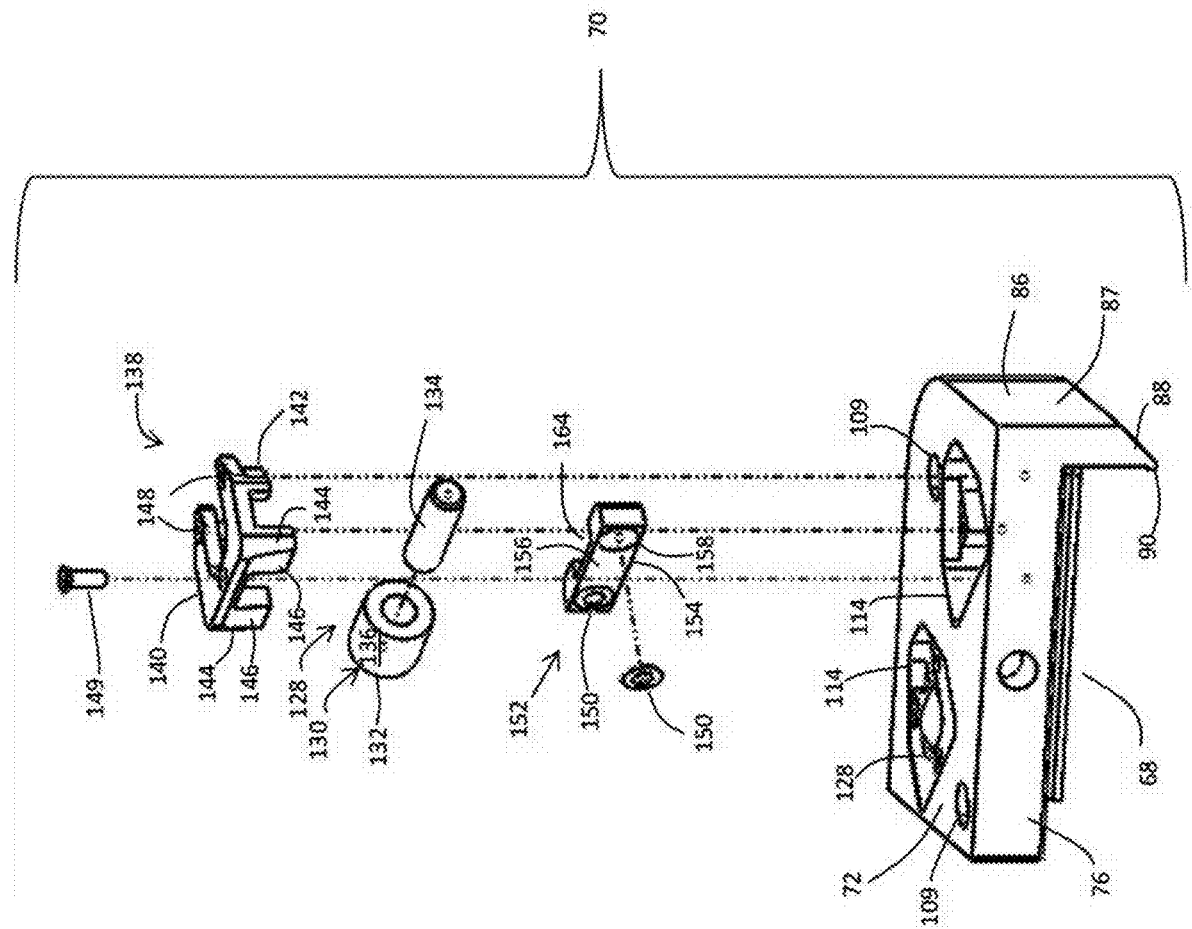
FIG. 21 is an alternative exploded, perspective view of the shroud portion of FIG. 18.
Figure 22:
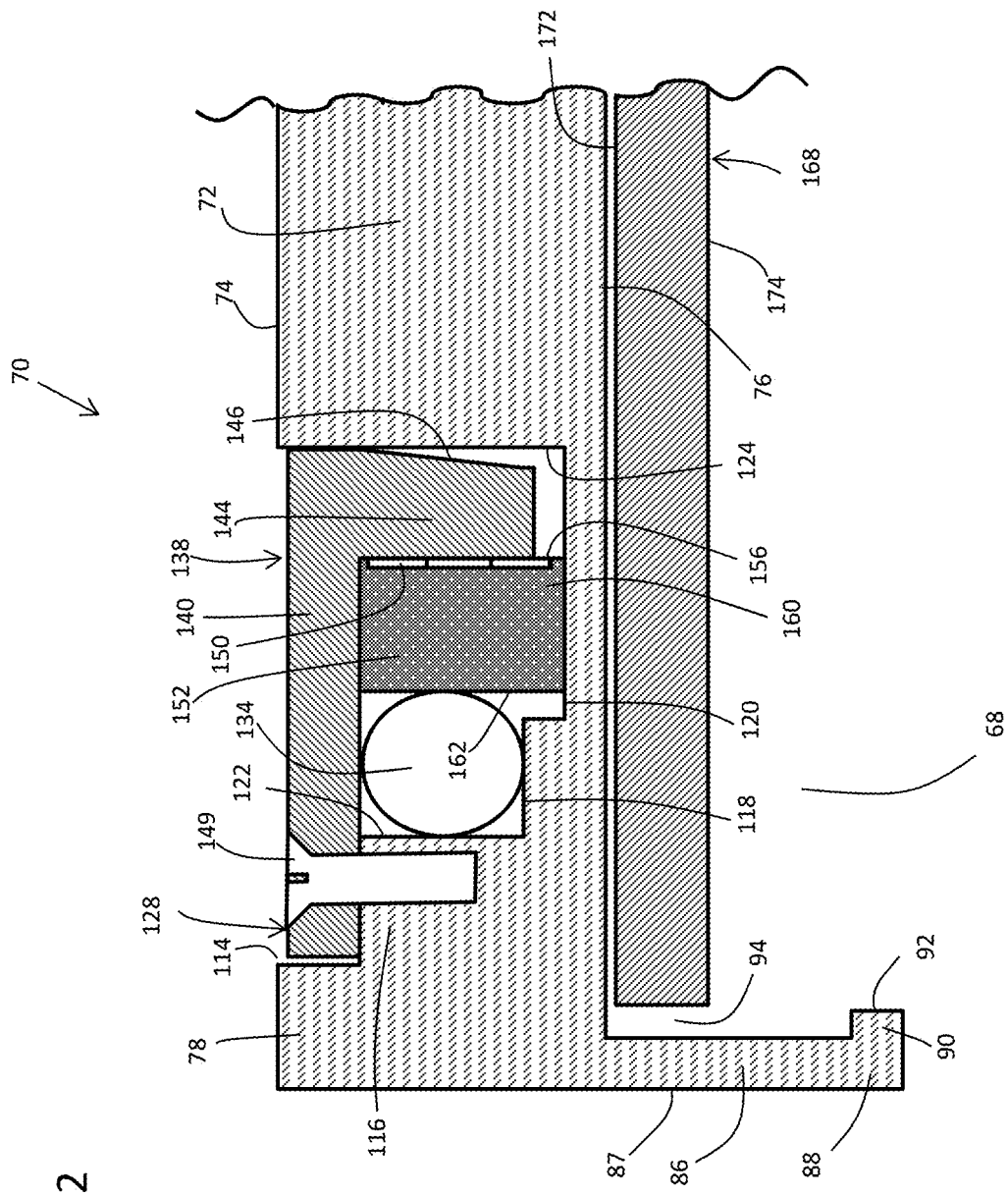
FIG. 22 is a schematic, side cross section view of a portion of the shroud portion of FIG. 18, showing how a bearing assembly is incorporated into a pocket of the shroud portion.

FIGS. 10 and 12 show how clamping shroud 66 responds to the action of actuating force 14 acting on clamping device 10 in the direction of main axis 15. Using coupling features described further below, the action of actuating force 14 along main axis 15 is sufficient to overcome the outward bias against shroud portions 70 that is provided by the springs 100 and 102. As a result, the action of actuating force 14 along main axis 15 is translated into lateral, inward motion of the shroud portion 70. The inward motion of the shroud portions 70 is a coordinated, lateral motion diagonally along the inward range of motion arrows 105. In the configuration of FIGS. 10 and 12, the gaps 96 and 98 are relatively narrow or even closed. FIGS. 10 and 12 shows clamping shroud 66 in the closed configuration in which the workpiece assembly 12 is peripherally gripped and clamped by the clamping shroud 66. For comparison, the footprint of the clamping shroud 66 in the open configuration (see FIGS. 8 and 9) is shown by the dotted line 108.

Clamping shroud 66 includes features that help to operatively couple clamping shroud 66 to the actuating member 194 and clamping body 168. As one illustrative set of features, and as seen best in FIGS. 1B, 1C, and 2-4, 6, 11, 12, 16, 18, 19, and 21, each shroud portion includes elongated slot apertures 109 in each shroud portion 70. For purposes of illustration, each shroud portion 70 includes a pair of elongated slot apertures 109 although only a single such aperture or three or more per shroud portion 70 may be used. The elongated slot apertures 109 are used to help pin the clamping shroud 66 to the clamping member by shafts 204 (described further below). This coupling is done in a manner that allows the clamping shroud portions 70 to move back and forth on demand through a range of motion schematically shown by directional range of motion arrows 104 and 105. In the meantime, the inner end 110 and outer end 112 of each elongated slot aperture 109 function as stops with respect to the shafts 204 so that the lateral range of motion has both inner and outer lateral limits.

As another illustrative set of features to operatively couple clamping shroud 66 to the actuating member 194 and clamping body 168, and as seen best in FIGS. 1D and 5, 7, 11, 12, 16, 17, 18, 19, 20, 21, and 22 the shroud portions 70 are configured with pockets 114 that hold bearing assemblies 128. The bearing assemblies 128 cooperate with complementary driving elements 212 (described further below) of actuating member 194. In cooperation, the bearing assemblies 128 and the driving elements 212 helps to convert a portion of the applied axial actuating force 14 into inward, coordinated, lateral motion of the shroud portions 70. This inward motion causes the shroud portions 70 to cooperatively grip and exert a peripheral clamping force 16 against workpiece assembly 12.

Each of the pockets 114 generally includes mounting bosses 116 that are used to mount a corresponding bearing assembly 128 in the pocket 114. As seen best in FIG. 22, the pocket 114 includes a raised floor 118 and a lower floor 120. Also as shown best in FIG. 22, the mounting boss includes wall 122, and the pocket further includes a pocket wall 124. When a bearing assembly 128 is mounted in its pocket 114, and as seen best in FIG. 18, the bearing assembly 128 only occupies a portion of the pocket. This leaves an open area 126 in the pocket. This open area 126 provides clearance to raise and lower a corresponding driving element 212 that engages the bearing assembly 128.

As seen best in FIGS. 18 through 22, Each bearing assembly 128 generally includes a bearing 130, yoke 138, bias member 150, and pressure bar 152. The bearing 130 includes roller 132 rotatably mounted on shaft 134. Roller 132 includes bearing surface 136 that operatively engages a corresponding driving element 212 so that driving pressure of driving element 212 against bearing surface 136 laterally drives the corresponding shroud portion 70 to move laterally inward to grip and peripherally clamp the workpiece assembly 12.

Yoke 138 serves as a bracket to help hold the other components of bearing assembly 128 in the proper operative positions. Yoke 138 includes a u-shaped yoke body 140. Yoke body 140 includes apertures 148 to mount the yoke 138 to the mounting bosses 116 of a corresponding pocket 114. Leading legs 142 and anterior legs 144 project from yoke body 140 downward into the pocket 114. As seen best in FIG. 22, the backsides of the anterior legs 144 are configured with a chamfer 146 to help provide a pressure fit between yoke 138 and the anterior pocket wall 124 when yoke 138 is mounted into the pocket 114. In combination with other features such as the bias member 150, this helps to eliminate any slack and to provide continuous, solid contact between the bearing surface 136 and the corresponding driving element 212. This helps to avoid undue backlash during clamping and unclamping operations between the bearing surface 136 and the driving element 212.

As another feature to avoid such backlash, bias member 150 performs a spring function to help pressure the bearing surface 136 against its driving element 212 during clamping and unclamping operations. A Bellville washer is one illustrative embodiment of the bias member 150. Such washers provide a suitable spring force but also are compact, cost effective, and easy to install.

Pressure bar 152 includes a base 154 having a rear face 156. The rear face 156 is configured with pockets 158 configured to help locate and hold the bias members 150 in position. Bosses 160 project from each end of the base 154. The bosses 160 include chamfers 166 so that the bosses 160 can reach through the leading legs 142 to contact and apply pressure against the shaft 134. A recess 164 between the bosses 160 provides a clearance for the rotating roller 132. Faces 162 on the bosses 160 engage the shaft 134.

FIGS. 18, 19, 20, 21, and 22 best show how the components of a bearing assembly 128 are put together and installed in a corresponding pocket 114. The shaft 134 of bearing 130 is positioned on the raised floor 118 while the pressure bar 152 is placed onto the lower floor 120. The yoke 138 is then lowered into position and mounted to the mounting bosses 116 with a suitable fastening technique, such as using screws 149. The chamfers 146 on the anterior legs 144 help to firmly position the yoke to prevent undue flexing or other motion that could lead to undue backlash between the bearing assembly 128 and its driving element 212. For each yoke 138, a pair of bias members 150 and the pressure bar 152 are trapped underneath the yoke body 140 between the leading legs 142 and the anterior legs 144. Enough clearance is provided so that the bias members can firmly press the pressure bar bosses 160 against the shaft 134. The roller shaft 134 is trapped underneath the yoke body 140 between the leading legs 142 and the mounting boss walls 122. Driven by the pressure of the bias members 150, the pressure bar 152 presses the shaft 134 against the boss walls 122 with enough pressure to prevent rotation, axial movement, or lateral movement of the shaft 134. The roller 132 is able to rotate freely as the bearing 130 engages the corresponding driving element 212.

FIGS. 1B through 1D, 2 through 7, 14 and 17 show more details of the clamping body 168. Clamping body 168 is housed at least partially inside of the resizable clamping enclosure 68. The clamping body 168 is thus axially interposed between the clamping shroud 66 and the workpiece assembly 12. Clamping body 168 can be actuated to apply a clamping force against the workpiece assembly 12 in the axial direction along main axis 15 responsive to the axial actuating force 14 acting on clamping device 10. Clamping body 168 includes a body member 170 having an upper face 172 and a lower face 174. Upper face 172 faces towards the interior faces 76 of the shroud portions 70. Lower face 174 faces toward the workpiece assembly 12. Rim 176 projects outward in the direction of main axis 15 from the periphery 178 of the lower face 174. Rim 176 has a clamping face 182 that directs an axial clamping force 18 onto the workpiece assembly 12 when the clamping device 10 is actuated by the axial actuating force 14. An inner recess 180 inside rim 176 provides a gap so that clamping force 18 is directed onto the workpiece assembly 12 through the clamping face 182 of the rim 176. The result is that the resultant clamping force 18 is applied downward onto the workpiece assembly 12 where the force 18 can be supported by the sidewalls 30 and 44 of the workpiece assembly 12. This avoids directing clamping force 18 into the central region of the cover 40, which could buckle or otherwise degrade the cover 40.

The clamping body 168 further includes through bores 184. Each through bore 184 includes counterbore 188 proximal to the workpiece assembly 12 and a narrow channel 186. Through bores 184 allow clamping body 168 to be coupled to the shroud portions 70 and the actuating member 194 by shafts 204 (described in more detail below).

During clamping and unclamping operations, relative lateral motion between the shroud portions 70, on the one hand, and the clamping body 168 occurs. This relative lateral motion may result in sliding contact between the shroud portions 70 and the clamping body 168. To reduce friction, to help reduce mechanical wearing, to avoid the generation of undue debris, or for other desired reasons, the interface between the shroud portions 70 and the clamping body 168 may be treated or configured to reduce lateral friction. As one way to reduce this friction, an optional low friction sheet 190 may be interposed at the interface. The low friction sheet 190 may be formed from one or more materials that are suitable to reduce friction in the presence of such sliding contact. In some embodiments, the sheet 190 may include one or more fluoropolymers, olefins, and combinations of these. In some embodiments, the low friction sheet 190 may include polytetrafluoroethylene, ultrahigh molecular weight polyethylene, nylon, combinations of these, and the like. One or both surfaces of sheet 190 optionally may be treated with a lubricant, such as a fluoropolymer or silicon-based dry lubricant, in order to further reduce friction.

The actuating member 194 is shown in more detail in FIGS. 1B through 1D, 2 through 7, and 13 through 17. Actuating member 194 includes pressure plate 196 and coupling member 216. Pressure plate 196 includes upper face 198 and lower face 200. Upper face 198 faces towards the coupling member 216. Lower face 200 faces towards clamping shroud 66. Lower face 200 includes threaded bores 202. Shafts 204 are fixedly coupled to the pressure plate 196 by these threaded bores 202. Thus, the shafts 204 and pressure plate are fixedly coupled together. The shafts 204 and pressure plate 196 thus move axially up and down together along the main axis 15 during clamping and unclamping operations (described further below).

Each shaft 204 includes a head 208 and shaft body 210 having a threaded end 206. The threaded end 206 of each shaft 204 is threaded into the threaded bores 202. The shafts 204 project outward from the lower face 200 parallel to main axis 15.

The shafts 204 are used to help operatively couple the actuating member 194 to the clamping shroud 66 and the clamping body 168. To this end, the head 208 of each shaft 204 fits into the corresponding counterbore 188. The counterbore 188 includes extra room so that the heads 208 a can move axially up and down inside the corresponding counterbore 188 along main axis 15 independently of axial motion (if any) of the clamping body 168. Shaft bodies 210 have a sliding fit within the corresponding narrow channel 186 to allow the shafts 205 to slide back and forth along main axis 15 independent of clamping body 168. The narrow channels 186 are configured with a close fit around shaft bodies 210 to allow this relative axial motion, yet the fit is snug enough to prevent undue lateral or twisting motion of the clamping body 168 relative to the actuating member 194.

Thus, one function of shafts 204 is to connect the actuating member 194 to the clamping body 168 to prevent relative lateral motion between the two components, but the actuating member 194 is able to move back and forth along main axis 15 through a range of motion effective to impart and release axial clamping forces on workpiece assembly 12 through the clamping shroud 66 and the clamping body 168. Additionally, as seen best in FIGS. 1C and 4, the heads 208 of the shafts 204 help to lift clamping shroud 66 and clamping body 168 away from the clamping zone to allow the workpiece assembly 12 to be placed into and removed from the clamping position.

The shaft bodies 208 of the shafts 204 also pass through the slotted apertures 109 of the clamping shroud 66 to help pin the clamping shroud 66 in place between the actuating member 194 and the clamping body 168. However, the slotted apertures are sufficiently elongated in the direction of the outward range of motion arrows 104 and the inward range of motion arrows 105 to allow the shroud portions 70 to be able to move laterally relative to the actuating member 194 back and forth through the desired range of motion in the directions of arrows 104 and 105. The shafts 204 thus function as limit stops to constrain the lateral motion of the shroud portions 70. The shaft bodies 208 are sufficiently long so that the actuating member 194 can be lifted off the clamping shroud 66 to release clamping pressure or pressed downward onto the clamping shroud 66 to help create both axial and lateral clamping forces 16 and 18 against workpiece assembly 12.

The shafts 204 also pass through corresponding apertures 192 in low friction sheet 190. These apertures 192 are a close fit to the shaft bodies 180 to help prevent relative lateral motion between the low friction sheet 190 and the clamping body 168 as well as between the low friction sheet 190 and the actuating member 194.

The actuating member 194 includes additional features that help to operatively couple the actuating member 194 to the clamping shroud 66. Driving elements 212 project from lower face 200 of the pressure plate 196 toward the clamping shroud 66. The pressure plate 196 includes a pair of driving elements 212 per shroud portion 70 in order to correspond to the number of bearing assemblies 128 incorporated into the pockets 114 of each shroud portion 70.

Each driving element 212 generally incorporates a ramped surface 214 with its widest point proximal to pressure plate 196 and a relative narrow end distal from pressure plate 196. The ramped surfaces 214 of the driving elements 212 are oriented in a manner effective to impart a driving force against a corresponding bearing assembly 128. As actuating member 194 is lowered responsive to an axial actuating force 14, the pressure from the ramped surfaces 214 drives the corresponding shroud portions 70 in the direction of the inward range of motion arrows 105. This overcomes the outward bias against the shroud portions 70 from springs 104 and 105 and laterally closes the shroud portions 70 in a coordinated fashion laterally inward toward the workpiece assembly 12. This closing action applies a lateral, circumferential clamping force against the periphery of workpiece assembly 12. When actuating member 194 is raised, the outward bias on the shroud portions 70 pushes the shroud portions outward to unclamp clamping shroud 66 from workpiece assembly 12.

Coupling member 216 is shown as a separate component that is fixedly attached to the pressure plate 194, but coupling member 216 and pressure plate 194 may be integrally formed as one unitary component. Coupling member 216 includes a lower surface 218 and an upper surface 220. Lower surface 218 is adjacent the pressure plate 196. Upper surface 220 faces toward a drive mechanism (not shown) generates the axial actuating forces 14 and 17 to raise and lower the actuating member 194, which in turn powers the clamping and unclamping operations. Coupling member 216 may be attached to pressure plate 194 using any suitable technique(s). Examples include rivets, clamps, bolts, screws, welding, brazing, adhesives, and the like.

Coupling member 216 is used to connect actuating member 194 to a drive mechanism (not shown) that can drive the actuating member 194 back and forth on demand along the main axis 14. When actuating member 194 is driven along main axis 14 toward the clamping shroud 66 and clamping body 168, this generates a resulting axial clamping force 15 against the clamping shroud 66 and clamping body 168. The clamping shroud 66 and the actuating member 194 include complementary features that help convert a portion of the axial actuating force 14 into a lateral clamping force 16 that laterally closes the clamping shroud 66, causing it to grip and peripherally clamp workpiece assembly 12. Additionally, the clamping shroud 66 also helps to transfer a portion of the axial actuating force 14 axially to the clamping body 168. This, in turn, causes clamping body 168 to exert an axial clamping force 18 against the workpiece assembly 12.

The use of clamping device 10 to carry out clamping and unclamping operations with respect to workpiece assembly 12 will now be described. In this illustrative discussion, clamping device 10 is used to hold workpiece assembly 12 with both an axial clamping force 18 and a circumferential clamping force 16 while the cover 40 is welded to the base deck 26. Advantageously, both the axial and clamping forces 16 and 18 are generated in response to a common axial actuating force 14.

Figure 4:
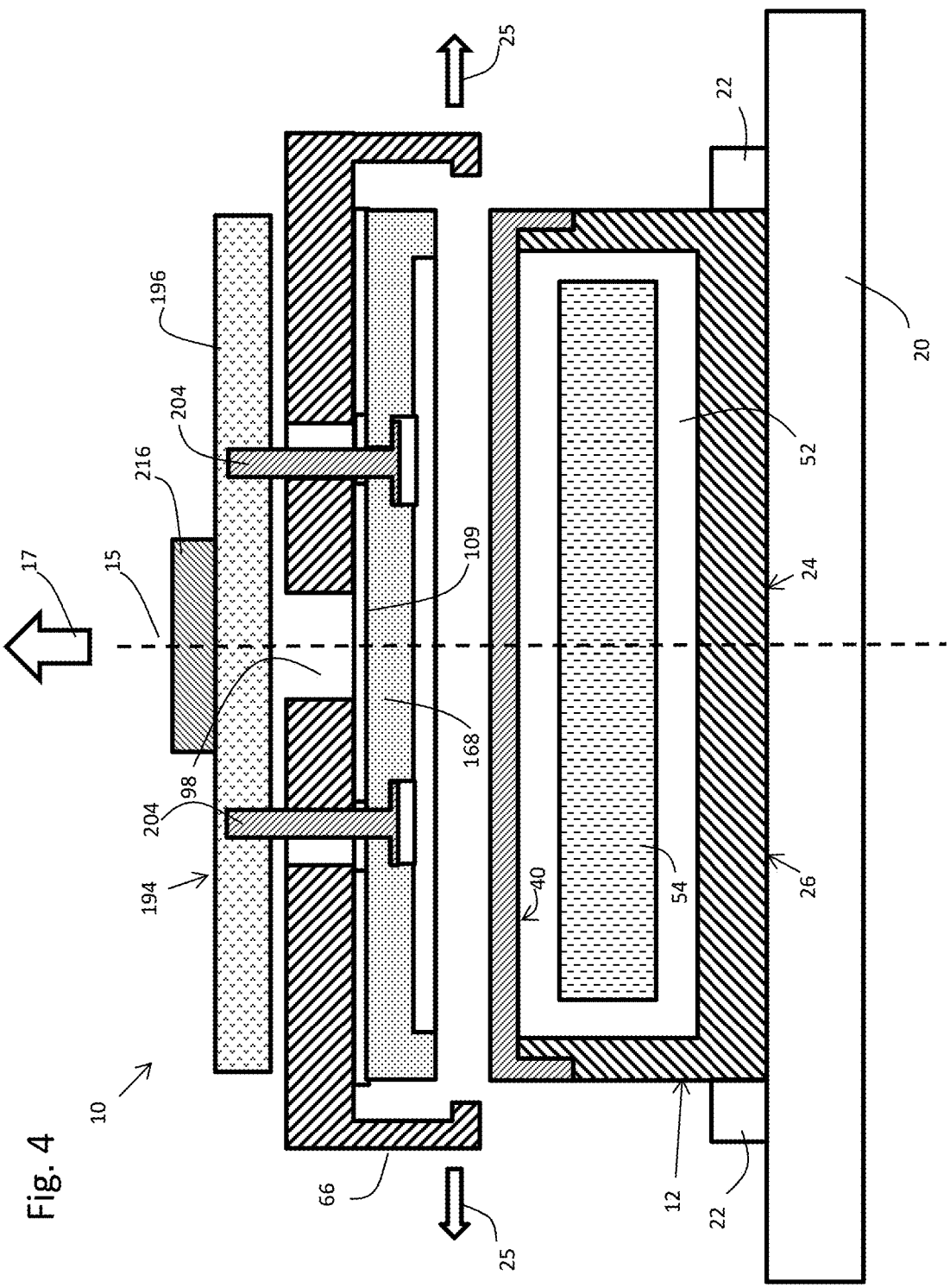
FIG. 4 schematically shows the view of FIG. 3 except that the clamping device is lifted off the workpiece assembly.
Figure 5:
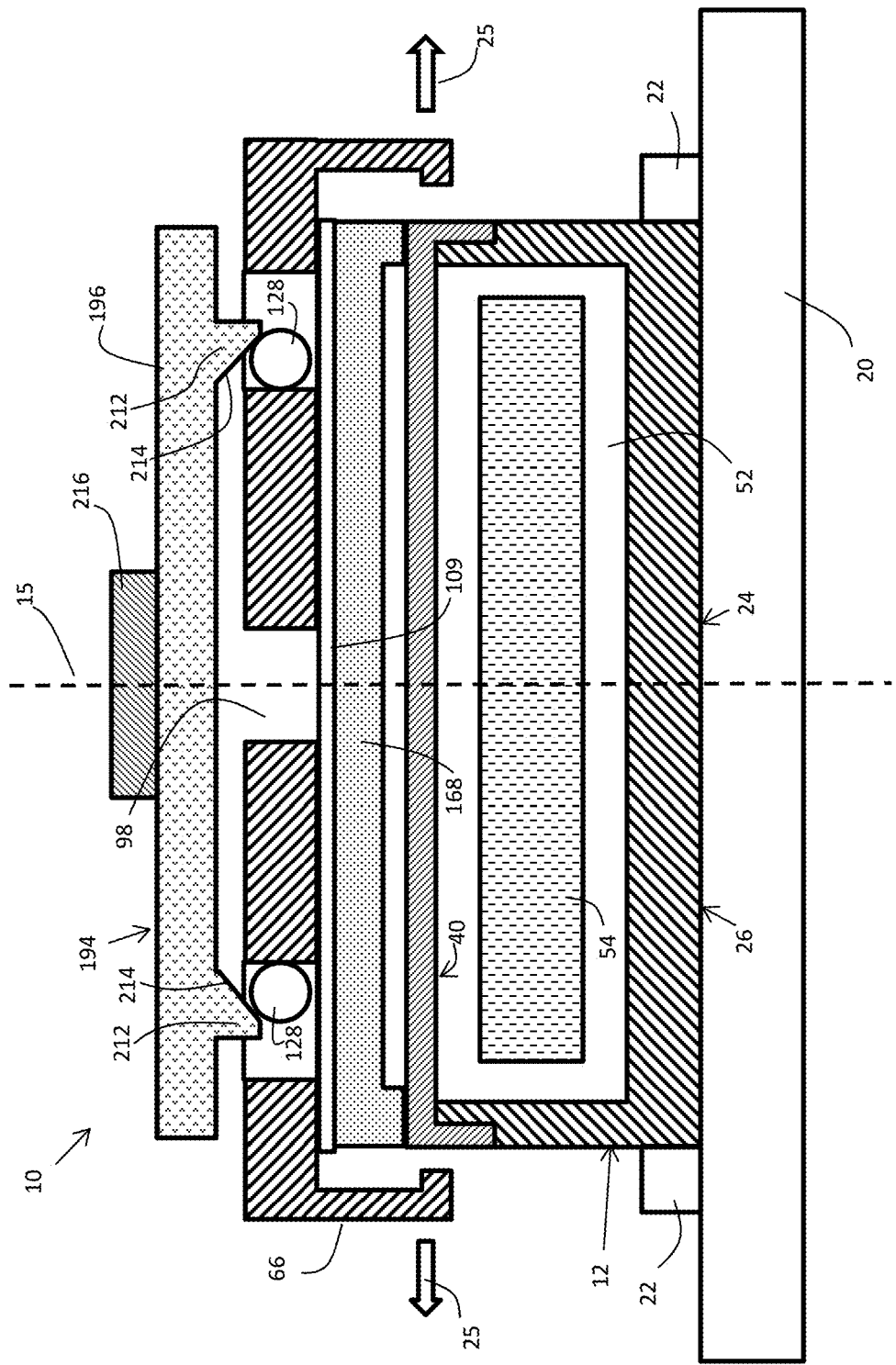
FIG. 5 schematically shows a further side cross section view of the clamping device and workpiece assembly of FIG. 2, wherein additional features of the clamping device are shown that allow an axial actuating force to cause clamping device component to be driven laterally inward to circumferentially clamp the workpiece assembly around at least a portion of the periphery of the workpiece assembly.

In FIG. 1A, the base deck 26 and cover 40 are placed into position on the support 20. Fixtures 22 help to hold the workpiece assembly 12 in the desired position. The clamping device 10 is not shown in FIG. 1. However, as an option, it may be present but lifted upward away from workpiece assembly 12 as shown in FIG. 4 responsive to an upward actuation force 17 to provide clearance for workpiece assembly 12 to be placed on the support 20.

In FIGS. 3, 5, 9, and 11, clamping device 10 is lowered onto the workpiece assembly 12, but the clamping device 10 is still in an open configuration in which workpiece assembly 12 is not yet fully clamped. Clamping device 10 is still in an open configuration with respect to the clamping shroud 66, and final axial clamping force 18 from clamping body 168 has not yet been developed. In this stage, clamping body 168 is resting on cover 40, but actuating member 194 is not pressing down yet onto the stack of the clamping shroud 66 and the clamping body 168. Accordingly, the bias provided by springs 104 and 105 pushes the shroud portions 70 laterally outward so that the jaws 90 are out of contact with the workpiece assembly 12. The outward, lateral move of the shroud portions 70 is limited as the inner ends 110 of the elongated slots 109 abut the shafts 204. Also, only the lower, narrower ends the driving elements 212 contact the bearing surfaces 136 as the actuating member 194 is raised an out of contact with the clamping shroud 66. In coordination with the elongated slots 109 and the shafts 204, the lower, narrower ends of the driving elements 212 pressing against the bearing surfaces 136 also help to limit the outward lateral range of motion of the shroud portions 70.

In FIGS. 6, 7, 10, and 12, responsive to the axial actuating force 14, clamping device 10 is in the closed configuration in which clamping device 10 grips the workpiece assembly 12 both a circumferential clamping force 16 and an axial clamping force 18. The circumferential and axial clamping forces 16 and 18 are developed in response to the common axial actuating force 14 resulting from axial pressure of the actuating member 194 against the clamping shroud 66. In practical effect, a portion of the axial actuating force 14 is converted into the circumferential clamping force 16 and another portions is converted into the axial clamping force 18.

As see in FIGS. 6, 7, 10, and 12, a driving mechanism (not shown) coupled to the coupling member 216 drives actuating member 194 axially along main axis 15 against the clamping shroud 66 to develop the axial actuating force 14. The shafts 204 move axially with the actuating member independently of any axial movement or clamping pressures developed among the clamping shroud 66 and the clamping body 168. As shafts 204 move axially through the elongated apertures 109 and through the bores 184, narrow channels 186 help to guide the shafts 204 and maintain axial alignment between the actuating member and the clamping body 168. The shafts 204 move relatively freely through the elongated apertures 109, preventing relative rotational movement between clamping shroud 66 but allowing the clamping shroud 66 to move laterally inward to the peripheral clamping configuration in the directions of arrows 105. Although not shown, the counterbores 188 of the through bores 184 can be enlarged to provide a clearance to allow axial movement of the heads 208 of the shafts 204, inasmuch as narrow channels 186 provide adequate guidance for the axial movement of shafts 204 relative to clamping body 168. Although not shown, the narrow channels 186 and optionally the counterbore 188 may be fitted with a low friction bearing to facilitate this relative axial movement.

Responsive to the axial actuation force 14, actuating member 194 presses axially against clamping shroud 66. In turn, clamping shroud 66 presses axially against clamping body 168 to develop the axial clamping force 18 against workpiece assembly 12. Clamping face 182 in rim 176 clamps against the outer periphery of cover 40, where the clamping force is supported by the sidewalls 30 and 44. The clamping body avoids contact with cover 40 in the area corresponding to the central recess 180.

Figure 7:
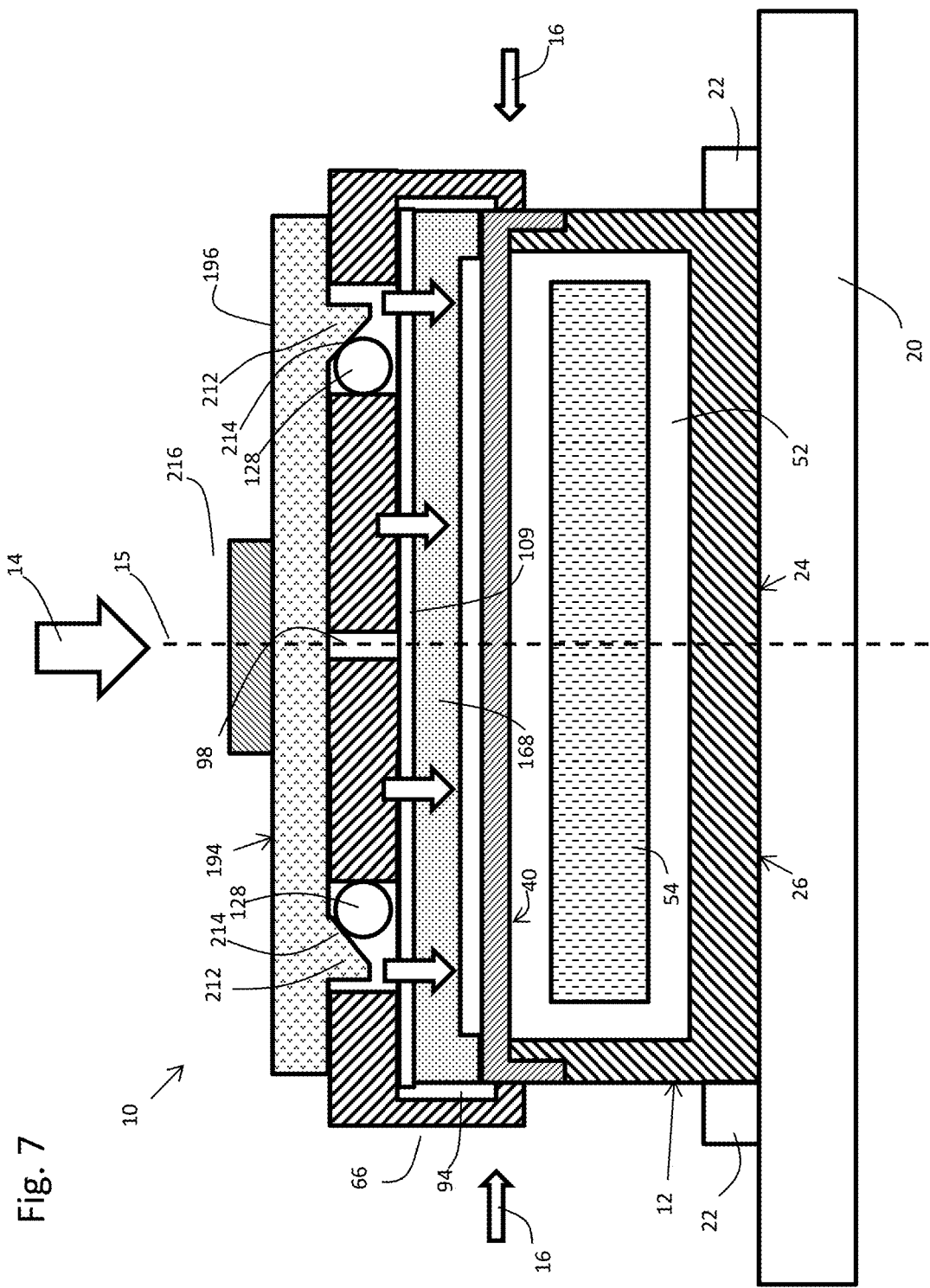
FIG. 7 schematically shows another view of the clamping device and workpiece assembly of FIG. 6 in which an axial actuation force develops both circumferential and axial clamping forces against the workpiece assembly.

At the same time, and as seen best in FIG. 7, driving elements 212 on the underside of the pressure plate 196 of actuating member 194 drivingly engage the bearing surfaces 136 of bearing assemblies 128 in the clamping shroud 66. This laterally drives the shroud portions 70 inward in a coordinated fashion, causing the clamping surfaces 92 on jaws 90 of sidewalls 86 to peripherally grip and peripherally clamp the cover 40 to the base deck 26. This peripheral gripping and clamping action is applied around the full periphery of the workpiece assembly 12 except in regions corresponding to the gaps 96 and 98, which may be partially open at this stage. Low friction sheet 190 helps to reduce friction and facilitate the lateral motion of the shroud portions 70 relative to clamping body 168. For a similar reason, additional low friction material (not shown) optionally could be placed on the lower face 200 of pressure plate 196 and/or on the exterior faces 70 of the shroud portions 70 to help reduce friction at this interface.

Figure 6:
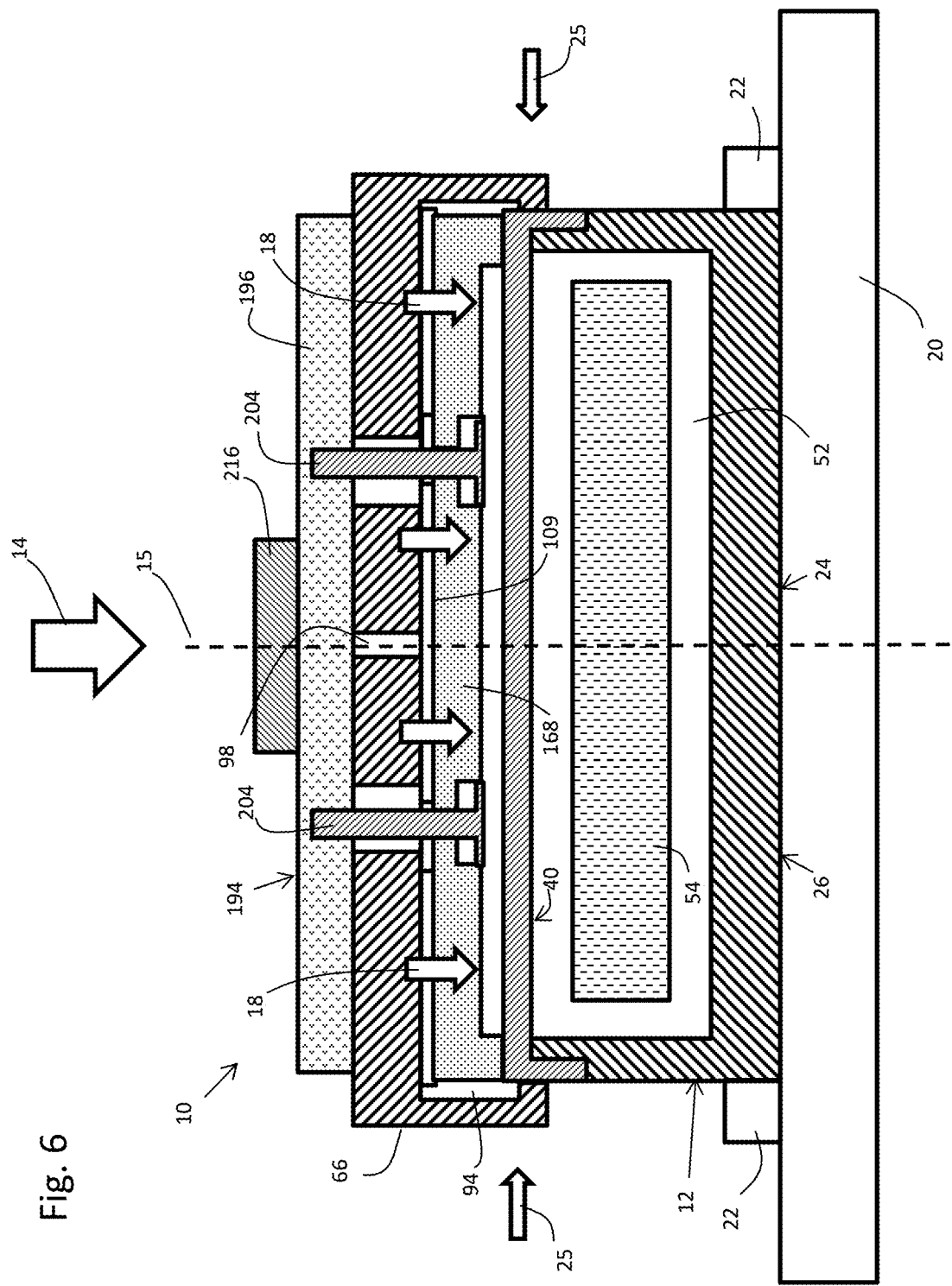
FIG. 6 schematically shows a further configuration of the clamping device and workpiece assembly of FIG. 3 in which an axial actuation force develops both circumferential and axial clamping forces against the workpiece assembly.

It is preferred that the gaps 96 and 98 remain partially open in this configuration so that full clamping pressure is developed as desired. If the gaps 96 and 98 were to fully close, it is possible that the gaps 96 and 98 could close up before the full clamping pressure is developed. Allowing a portion of the gaps 96 and 98 to remain avoids this risk. For a similar reason, FIG. 6 shows how the shroud portions 70 have moved inward to develop the full peripheral clamping force 16, but the shafts 204 did not yet reach the outer ends 112 of slots 109. If shafts 204 were to hit the limit of the outer ends 112, it is possible that this limit could be reached before the full peripheral clamping force 16 is developed. Providing extra clearance in the slot 109 avoids this risk.

Referring again mainly to FIG. 7, note that the circumferential clamping pressure is even developed through the corner regions of workpiece assembly 12 to provide both circumferential clamping force 16 as well as structural support to avoid an undue risk that the axial clamping force 18 might distort or otherwise degrade the cover 40 or base deck 26 at the corners or on the sides.

While workpiece assembly 12 is axially and circumferential clamped as shown in FIGS. 6, 7, 10, and 12, the lap joint 48 and seam 50 can be welded or otherwise joined in order to secure the cover 40 to base deck 26 and thereby seal the hard disk drive assembly 54 inside the protection provided by the now sealed enclosed chamber 52. After the sealing operation is completed, FIG. 4 shows best how the clamping device 10 can be lifted off the workpiece assembly 12 by the upward actuation force 18 resulting from the driving mechanism (not shown) pulling upward on the actuating member. This upward, axial motion, releases the pressure of actuating member 194 on the clamping shroud 66. As a consequence, both the circumferential and axial clamping forces 16 and 18 are released. As the actuating member 194 moves axially away from the clamping shroud 66, the driving force of the driving elements 212 moves laterally outward, allowing the shroud portions 70 to move laterally outward as well under the bias of springs 104 and 105. Workpiece assembly 12 can now be further processed, packaged, made available for use, or otherwise handled as desired.

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A clamping device for holding a workpiece assembly with an axial clamping force and a circumferential clamping force responsive to an axial actuation force acting on the clamping device, said clamping device comprising:
   a) a circumferentially resizable, subdivided clamping shroud defining a circumferentially resizable clamping enclosure, said clamping shroud comprising a plurality of shroud portions that are laterally translatable on demand, wherein the shroud portions are coupled together such that lateral translation of the shroud portions occurs in a coordinated manner through a range of motion comprising an open configuration in which the shroud portions are relatively farther apart relative to each other such that the clamping shroud is circumferentially enlarged relative to the workpiece assembly and a clamping configuration in which the shroud portions are relatively closer together laterally relative to each other such that the clamping shroud is circumferentially closed in a manner effective for the clamping shroud to circumferentially grip and clamp the workpiece assembly, wherein the shroud portions are under a bias to be in the open configuration, wherein the shroud portions are translated to the closed configuration in opposition to said bias responsive to the axial actuation force acting on the clamping device, and wherein at least one of the shroud portions comprises at least one corresponding bearing surface;
   b) a clamping body housed at least partially in the resizable clamping enclosure, said clamping body being axially interposed between the clamping shroud and the workpiece assembly; and
   c) an actuating member coupled to the clamping shroud in a manner such that the axial actuation force acting on the clamping device causes the actuating member (i) to engage the at least one corresponding bearing surface of at least one shroud portion in a manner effective to both drive the at least one shroud portion laterally inward to cause the resizable clamping shroud to circumferentially grip and clamp the workpiece assembly, and (ii) to cause the clamping body to axially engage the clamping shroud and cause the clamping shroud to axially press against the clamping body to apply an axial clamping force against the workpiece assembly.

2. The clamping device of claim 1, wherein a shroud portion includes a cover panel and a sidewall extending from the cover panel.

3. The clamping device of claim 2, wherein the sidewall of the shroud includes a lower rim and a clamping jaw proximal to the lower rim that projects laterally inward toward the inside of the clamping enclosure.

4. The clamping device of claim 1, wherein the shroud portions are configured to subdivide the clamping shroud into quadrants, and wherein the shroud portions are separated by resizable side to side gaps and resizable end to end gaps.

5. The clamping device of claim 3, wherein the sidewall extends continuously around the outer periphery of the shroud portion.

6. The clamping device of claim 5, wherein the sidewall has an L-shape.

7. The clamping device of claim 3, wherein a gap is formed between the sidewall and the clamping body when the clamping device Is in the closed configuration.

8. The clamping device of claim 1, further comprising at least one lateral spring that provides a portion of the bias by laterally pushing against laterally adjacent shroud portions.

9. The clamping device of claim 1, further comprising at least one longitudinal spring that provides a portion of the bias by laterally pushing against longitudinally adjacent shroud portions.

10. The clamping device of claim 1, wherein a coordinated, inward motion of the shroud portions occurs under the actuating force in a manner to cause a coordinated, lateral motion of the shroud portions that is diagonally inward.

11. The clamping device of claim 1, wherein a shroud portion includes at least one elongated slot that houses a shaft that helps to couple the actuating member, the clamping shroud, and the clamping body together.

12. The clamping device of claim 11, wherein the elongated slot includes an inner end and an outer end, and wherein the inner and outer ends of the elongated slot function as stops for the shaft so that the range of motion of the shroud portion has an inner limit and an outer limit.

13. The clamping device of claim 1, wherein a shroud portion comprises a bearing assembly mounted in a pocket, and wherein the actuating member comprises a complementary driving element that engages the bearing assembly in a manner effective to convert a portion of the axial clamping force into an inward, lateral motion of the shroud portion.

14. The clamping device of claim 13, wherein the driving element comprises a ramp that engages the bearing assembly.

15. The clamping device of claim 13, wherein the bearing assembly comprises a u-shaped yoke body.

16. The clamping device of claim 15, wherein the yoke body comprises a backside and a chamfer on the backside, wherein the chamfer helps to provide a friction fit between the bearing assembly and the pocket.

17. The clamping device of claim 13, wherein the bearing assembly further comprises a bias member that helps to pressure a bearing surface of the bearing assembly against the driving element.

18. The clamping device of claim 1, wherein a low friction sheet is interposed between the shroud portion and the clamping body in order to reduce friction during relative lateral motion between the shroud portion and the clamping body.

19. The clamping device of claim 1, wherein a plurality of shafts couple the clamping body to the actuating member, and wherein the shafts pass through elongated slots in the shroud portions.

20. The clamping device of claim 1, wherein the shafts fixedly couple the clamping body to the actuating member such that the clamping body and the actuating member move axially together.

* * * * *